US010522576B2

(12) United States Patent
Chalmers, Jr.

(10) Patent No.: US 10,522,576 B2
(45) Date of Patent: Dec. 31, 2019

(54) WIDE DYNAMIC RANGE PHOTO SENSOR

(71) Applicant: WcSystems Corporation, Richardson, TX (US)

(72) Inventor: Wallace D. Chalmers, Jr., Mesquite, TX (US)

(73) Assignee: WCSystems Corporation, Richardson, TX (US)

( * ) Notice: Subject to any disclaimer, the term of this patent is extended or adjusted under 35 U.S.C. 154(b) by 77 days.

(21) Appl. No.: 15/659,588

(22) Filed: Jul. 25, 2017

(65) Prior Publication Data
US 2018/0033815 A1 Feb. 1, 2018

Related U.S. Application Data

(60) Provisional application No. 62/367,325, filed on Jul. 27, 2016, provisional application No. 62/378,214, filed on Aug. 23, 2016.

(51) Int. Cl.
H03F 3/08 (2006.01)
H01L 27/146 (2006.01)
G01J 1/04 (2006.01)
H03G 3/30 (2006.01)
H04B 10/69 (2013.01)

(52) U.S. Cl.
CPC ...... *H01L 27/14601* (2013.01); *G01J 1/0488* (2013.01); *H01L 27/14643* (2013.01); *H03F 3/087* (2013.01); *H03G 3/3084* (2013.01); *H04B 10/69* (2013.01)

(58) Field of Classification Search
CPC .................. H03F 3/087; H03F 2203/45528
See application file for complete search history.

(56) References Cited

U.S. PATENT DOCUMENTS

| 4,698,817 | A | 10/1987 | Burley |
| 4,843,583 | A | 6/1989 | White et al. |
| 5,051,707 | A | 9/1991 | Fujita |
| 5,168,148 | A | 12/1992 | Giebel |
| 5,621,205 | A | 4/1997 | Warner et al. |
| 6,073,848 | A | 6/2000 | Giebel |
| 6,369,850 | B1 | 4/2002 | Tanaka |
| 6,811,087 | B2 | 11/2004 | Nakamura et al. |
| 7,443,435 | B2 | 10/2008 | Loose |

(Continued)

FOREIGN PATENT DOCUMENTS

WO 2013190423 A1 12/2013

OTHER PUBLICATIONS

International Search Report and Written Opinion received in Patent Cooperation Treaty Application No. PCT/US2017/043813, dated Oct. 5, 2017, 15 pages.

*Primary Examiner* — Thanh Luu
(74) *Attorney, Agent, or Firm* — Hubbard Johnston, PLLC

(57) ABSTRACT

Some embodiments described herein are directed to a photo sensor and a method of operating a photo sensor. In an embodiment, a photo sensor comprises a photo diode, a filter circuit, and an output circuit. The filter circuit has an input node configured to be electrically coupled to an output node of the photo diode, and has an output node. The filter circuit has an adjustable gain, and the adjustable gain is adjustable based on a signal output from the filter circuit. The output circuit has an input node configured to be electrically coupled to the output node of the filter circuit.

17 Claims, 16 Drawing Sheets

(56) References Cited

U.S. PATENT DOCUMENTS

| | | |
|---|---|---|
| 9,038,917 B2 | 5/2015 | Hirono et al. |
| 2002/0093641 A1 | 7/2002 | Ortyn et al. |
| 2004/0085543 A1 | 5/2004 | Xie et al. |
| 2005/0200421 A1 | 9/2005 | Bae et al. |
| 2007/0171285 A1 | 7/2007 | Takiba |
| 2008/0112712 A1* | 5/2008 | Inoue .................. H03F 3/087 398/208 |
| 2008/0217516 A1 | 9/2008 | Suzuki et al. |
| 2008/0230684 A1 | 9/2008 | Chew et al. |
| 2010/0277075 A1 | 11/2010 | Rees |
| 2012/0038786 A1 | 2/2012 | Kelly et al. |
| 2013/0154726 A1 | 6/2013 | Krebs |
| 2014/0097901 A1 | 4/2014 | Sano et al. |

* cited by examiner

WIDE DYNAMIC RANGE PHOTO SENSOR

CROSS-REFERENCE TO RELATED APPLICATION

This application claims priority to and the benefit of U.S. Provisional Application Ser. No. 62/367,325, titled "Wide Dynamic Range Photo Sensor," filed Jul. 27, 2016, and U.S. Provisional Application Ser. No. 62/378,214, titled "Wide Dynamic Range Photo Sensor with Clock," filed Aug. 23, 2016, which applications are incorporated herein by reference in their entireties.

BACKGROUND

Photo sensors generally are devices that detect the presence of an optical signal or light by, for example, converting the optical signal or light into an electrical signal. The electrical signal can then be used or processed based on the application in which the photo sensor is used. Photo sensors can have utility in multiple different applications. For example, photo sensors can be used in medical equipment, automotive products, commercial electronics, industrial applications, smart meters, and others.

DESCRIPTION OF THE DRAWINGS

Illustrative embodiments of the present invention are described in detail below with reference to the attached drawing figures, which are incorporated by reference herein and wherein.

DETAILED DESCRIPTION

Figure 1:
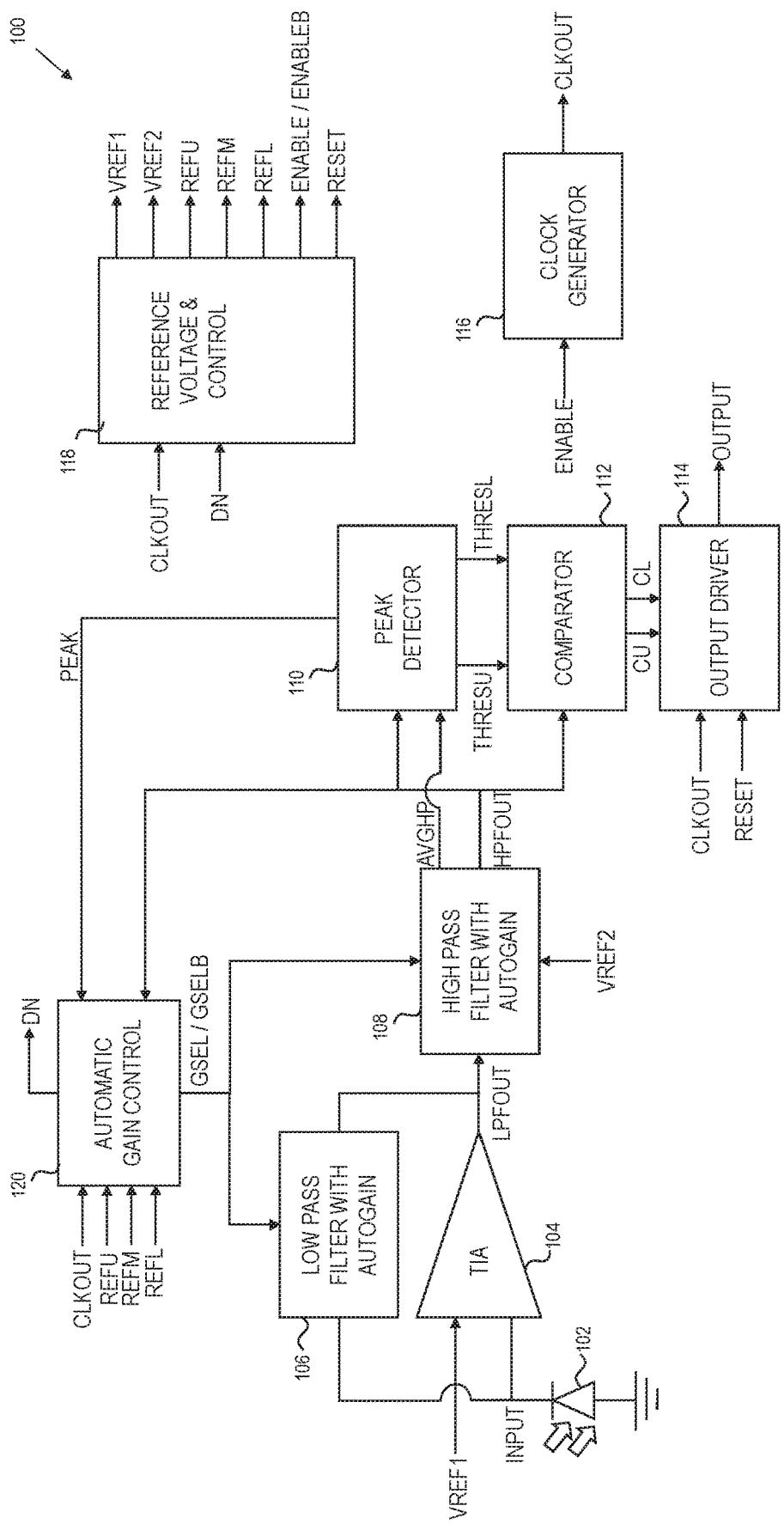
FIG. 1 is a simplified schematic of an example photo sensor in accordance with some embodiments.

In the following detailed description of the disclosed embodiments, reference is made to the accompanying drawings that form a part hereof, and in which is shown, by way of illustration, specific embodiments in which the invention may be practiced. These embodiments are described in sufficient detail to enable those skilled in the art to practice the invention, and it is understood that other embodiments may be utilized and that logical structural, mechanical, and/or electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the claims.

Some detail that may be omitted in the following description is summarized here for simplicity. A device, such as a passive device like a resistor or capacitor, may be described as having a "first terminal" and a "second terminal;" as used herein, the operative portion of the device (like the resistive element of a resistor) is disposed between the first terminal and the second terminal of the device. Various devices and components may be electrically connected between power supply nodes, such as a first power supply node VDD and a second power supply node VSS (such as a ground node), and some devices and components may be electrically connected to various bias voltage nodes. Explicit description of some of these electrical connections to power supply nodes and/or bias voltage nodes may be omitted herein, but a person having ordinary skill in the art will readily understand the presence of such electrical connections from the nature of the figures. Further, some components may be present in implementations that may be omitted from the figures and description herein to avoid obscuring aspects of embodiments, but a person having ordinary skill in the art will readily understand the presence of such components. Also, shorthand notations may be used herein for more concise explanation, such as "∥" that indicates parallel connected devices, that are readily understood by a person having ordinary skill in the art. For example, a person having ordinary skill in the art will understand the total impedance resulting from multiple parallel connected devices (as indicated, for example, like "R1∥C1∥R2∥C2") rather than a prolonged mathematical representation of such impedance. Logic signals described herein may also be in the form of a logical high (or digital high or logical "1") or in the form of a logical low (or digital low or logical "0"), which would be understood by a person having ordinary skill in the art. Unless otherwise indicated, as used throughout this document, "or" does not require mutual exclusivity.

Embodiments described herein generally relate to photo sensors. Some embodiments can accommodate a wide range of power levels of a signal input from a photo diode without saturating various signals of the photo sensor, which if saturated, may cause a faulty output signal. Generally, the disclosed embodiments adjust one or more gains of circuits, such as a low pass filter and/or a high pass filter, to accommodate the various power levels of the signal that is input. Embodiments can have other advantages, including advantages described herein, among others. A person having ordinary skill in the art will readily understand that circuits described herein can take various other forms, including in hardware and/or software, while maintaining the same or similar functionality or operability described herein, which forms are within the scope of the present disclosure.

FIG. 1 illustrates a simplified schematic of an example photo sensor 100 in accordance with some embodiments. Various portions of the photo sensor 100 are illustrated with more detail in FIGS. 2 through 6, 7A, 7B, 8A, and 8B below, in accordance with some embodiments. The photo sensor 100 may be an integrated solution formed on a single chip or semiconductor die. Further, the photo sensor 100 may be capable of detecting a wide range of optical power, such as from 3 µW to 65 µW; although other example photo sensors may be capable of detecting other ranges of optical power. Other example photo sensors may omit some components and/or may include additional components compared to the photo sensor 100 illustrated in FIG. 1.

The photo sensor 100 includes a photo diode 102. The photo diode 102 includes a p-n junction in a semiconductor substrate of the chip or die, which substrate may be a p-type substrate, for example. In some implementations, the photo diode 102 has an area upon which an optical signal or light may impinge of 0.196 mm$^2$. In some implementations, the spectral sensitivity of the photo diode 102 for optical signals having wavelengths of 800 to 1,000 nm may be 0.3 A/W to 0.05 A/W, and the photo diode 902 may output approximately 150 nA at a lower bound for an optical signal having a power of 3 µW and approximately 19.5 µA at an upper bound for an optical signal having a power of 65 µW. The anode of the photo diode 102 is electrically connected to a ground node, while the cathode of the photo diode 102 is electrically connected to an input signal node INPUT. The input signal node INPUT is electrically connected to a first input terminal of a transimpedance amplifier (TIA) 104. A first reference voltage node VREF1 is electrically connected to a second input terminal of the TIA 104.

The photo sensor 100 includes a low pass filter 106 that includes automatic gain selection capability. The low pass filter 106 is electrically connected between the first input terminal of the TIA 104 and an output terminal of the TIA 104 at a low pass filter output node LPFOUT. The photo sensor 100 includes a high pass filter 108 that includes automatic gain selection capability. Respective input nodes of the high pass filter 108 are electrically connected to the low pass filter output node LPFOUT and to a second reference voltage node VREF2. An output node of the high pass filter 108 is electrically connected to a high pass filter output node HPFOUT, which is electrically connected to respective input nodes of a peak detector 110, a comparator circuit 112, and a gain control circuit 120. Another output node of the high pass filter 108 is electrically connected to an average high pass filter signal node AVGHP, which is electrically connected to an input node of the peak detector 110. A first output node of the peak detector 110 is electrically connected to a peak detect output node PEAK, which is electrically connected to an input node of the gain control circuit 120. Respective second and third output nodes of the peak detector 110 are electrically connected to an upper channel node CU and a lower channel node CL, which are electrically connected to respective input nodes of an output driver 114. Additional respective input nodes of the output driver 114 are electrically connected to an output clock node CLKOUT and a reset node RESET. An output node of the output driver 114 is electrically connected to an output signal node OUTPUT on which an output signal is provided.

A clock generator 116 has an output node electrically connected to the output clock node CLKOUT and an input node electrically connected to an enable signal node ENABLE. A reference voltage and control circuit 118 has respective output nodes electrically connected to the first reference voltage node VREF1, the second reference voltage node VREF2, an upper voltage reference node REFU, a middle voltage reference node REFM, a lower voltage reference node REFL, the enable signal node ENABLE, a complementary enable signal node ENABLEB, and the reset node RESET. The reference voltage and control circuit 118 has respective input nodes electrically connected to the output clock node CLKOUT and a down signal indication node DN.

The gain control circuit 120 has respective input nodes electrically connected to the output clock node CLKOUT, the upper voltage reference node REFU, the middle voltage reference node REFM, and the lower voltage reference node REFL in addition to the input nodes electrically connected to the high pass filter output node HPFOUT and the peak detect output node PEAK. The gain control circuit 120 has respective output nodes electrically connected to the gain select signal bit nodes GSEL and complementary gain select signal bit nodes GSELB, which are electrically connected to respective input nodes of the low pass filter 106 and high pass filter 108. The gain control circuit 120 has another output node electrically connected to the down signal indication node DN.

A simplified, general description of the operation of the photo sensor 100 is now provided. This simplified description assumes normal operating conditions, e.g., operations are enabled (e.g., via the enable signal node ENABLE) and no reset condition exists (e.g., via the reset node RESET). An input signal from the photo diode 102, based on a received optical signal or light, is input to the TIA 104 and low pass filter 106, which has some selected low pass filter gain. Based on the input signal, a low pass filter output signal, with some gain relative to the input signal and based on the selected low pass filter gain, is output to the high pass filter 108, which has some selected high pass filter gain. Based on the low pass filter output signal, a high pass filter output signal, with some gain relative to the low pass filter output signal and based on the selected high pass filter gain, is output to the peak detector 110 and the comparator circuit 112. The peak detector 110 determines a peak signal (e.g., on peak detect output node PEAK) and upper and lower thresholds (e.g., on upper threshold node THRESU and lower threshold node THRESL, respectively). The comparator circuit 112 compares the high pass filter output signal to the upper and lower thresholds to generate upper and lower channel signals (e.g., on upper channel node CU and lower channel node CL, respectively). Based on the upper and lower channel signals, the output driver 114 generates an output signal on the output signal node OUTPUT.

To control the gains in the low pass filter 106 and high pass filter 108, the high pass filter output signal and peak signal are input to the gain control circuit 120. The gain control circuit 120 compares the high pass filter output signal to reference voltages on upper voltage reference node REFU and middle voltage reference node REFM and compares the peak signal to a reference voltage on the lower voltage reference node REFL. The logical results of these comparisons are input to control logic that determines gain select signals and complementary gain select signals that are input to the low pass filter 106 and high pass filter 108, which in turn select and adjust gains in the low pass filter 106 and high pass filter 108.

Figure 2:
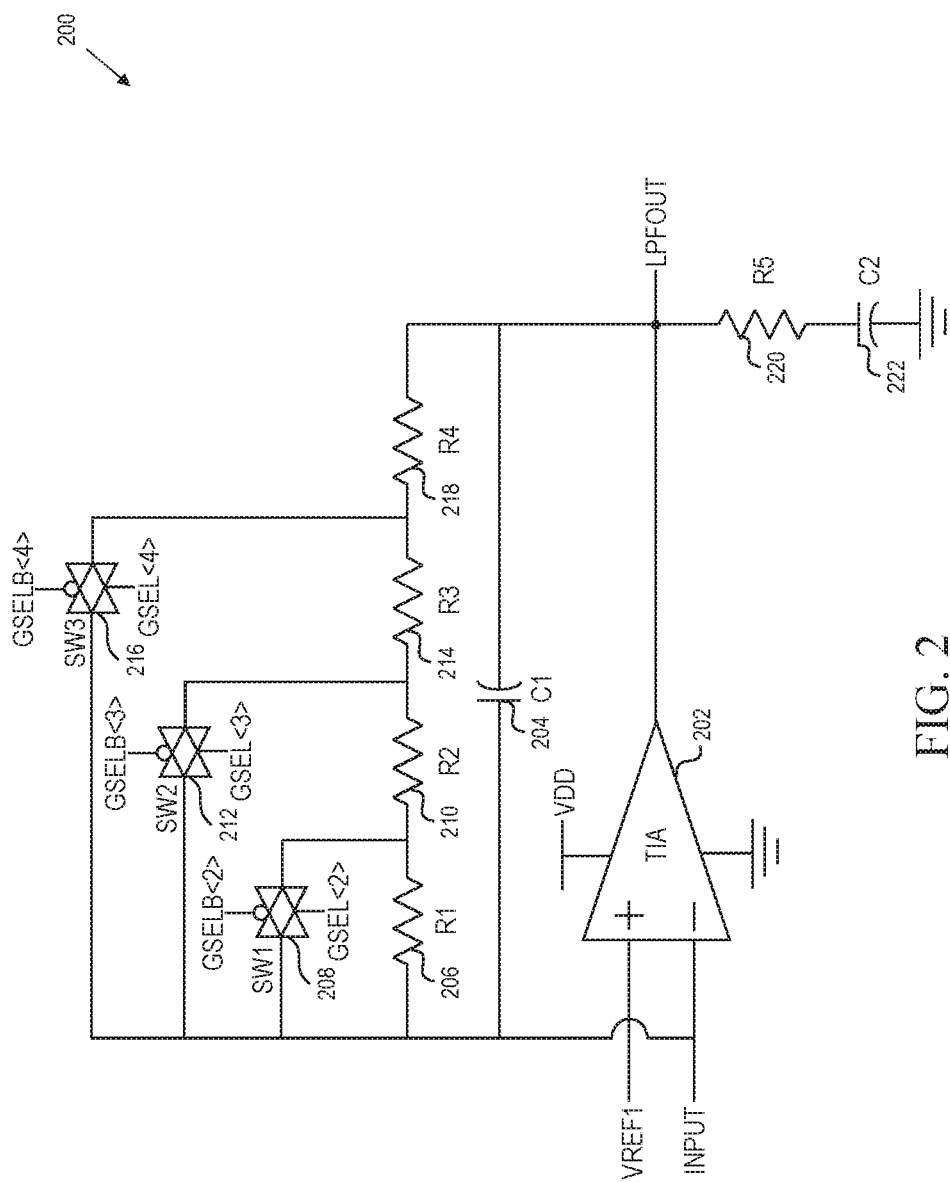
FIG. 2 is an example front-end circuit comprising a transimpedance amplifier (TIA) and a low pass filter in accordance with some embodiments.

FIG. 2 is an example front-end circuit 200 comprising a TIA 202 and a low pass filter in accordance with some embodiments. In the front-end circuit 200, the first reference voltage node VREF1 is electrically connected to the non-inverting input terminal of the TIA 202. The input signal node INPUT (which, for example, is electrically connected to the cathode of the photo diode 102) is electrically connected to the inverting input terminals of the TIA 202. A first capacitor C1 204 is electrically connected between the input signal node INPUT and a low pass filter output node LPFOUT. The low pass filter output node LPFOUT is further electrically connected to the output terminal of the TIA 202. A serially connected fifth resistor R5 220 and second capacitor C2 222 are connected between the low pass filter output node LPFOUT and a ground node.

Low pass filter gain selection circuitry is further electrically connected between the input signal node INPUT and the low pass filter output node LPFOUT. The low pass filter gain selection circuitry comprises first, second, third, and fourth resistors R1 206, R2 210, R3 214, and R4 128, respectively, and first, second, and third switches SW1 208, SW2 212, and SW3 216, respectively. A first terminal of the first resistor R1 206 and respective first pass-through terminals of the first switch SW1 208, second switch SW2 212, and third switch SW3 216 are electrically connected to the input signal node INPUT. A second terminal of the first resistor R1 206 is electrically connected to a second pass-through terminal of the first switch SW1 208 and to a first terminal of the second resistor R2 210. A second terminal of the second resistor R2 210 is electrically connected to a second pass-through terminal of the second switch SW2 212 and to a first terminal of the third resistor R3 214. A second terminal of the third resistor R3 214 is electrically connected to a second pass-through terminal of the third switch SW3 216 and to a first terminal of the fourth resistor R4 218. A second terminal of the fourth resistor R4 218 is electrically connected to the low pass filter output node LPFOUT.

The first, second, and third switches SW1 208, SW2 212, and SW3 216 can be any type of switch, and in the illustrated example, the first, second, and third switches SW1 208, SW2 212, and SW3 216 are transmission gates. Hence, in the illustrated example, the first, second, and third switches SW1 208, SW2 212, and SW3 216 are controlled to be in open and closed states by respective signals on gain select signal third through fifth bit nodes GSEL<2:4> and complementary gain select signal third through fifth bit nodes GSELB<2:4>. For example, a gain select signal third bit node GSEL<2> is electrically connected to a high-enabled control input terminal of the first switch SW1 208, and a complementary gain select signal third bit node GSELB<2> is electrically connected to a low-enabled control input terminal of the first switch SW1 208. A gain select signal fourth bit node GSEL<3> is electrically connected to a high-enabled control input terminal of the second switch SW2 212, and a complementary gain select signal fourth bit node GSELB<3> is electrically connected to a low-enabled control input terminal of the second switch SW2 212. A gain select signal fifth bit node GSEL<4> is electrically connected to a high-enabled control input terminal of the third switch SW3 216, and a complementary gain select signal fifth bit node GSELB<4> is electrically connected to a low-enabled control input terminal of the third switch SW3 216.

In the configuration of the illustrated example, the low pass filter can have four different gains based on the configuration of the low pass filter gain selection circuitry. If the first switch SW1 208, second switch SW2 212, and third switch SW3 216 are open, the total resistance of the low pass filter gain selection circuitry $R_{SELTL}$ between the input signal node INPUT and low pass filter output node LPFOUT is R1+R2+R3+R4. If the first switch SW1 208 is closed and the second switch SW2 212 and third switch SW3 216 are open, the total resistance of the low pass filter gain selection circuitry $R_{SELTL}$ between the input signal node INPUT and low pass filter output node LPFOUT is R2+R3+R4. If the second switch SW2 212 is closed, the third switch SW3 216 is open, and the first switch SW1 208 may be open or closed, the total resistance of the low pass filter gain selection circuitry $R_{SELTL}$ between the input signal node INPUT and low pass filter output node LPFOUT is R3+R4. If the third switch SW3 216 is closed and the first switch SW1 208 and second switch SW2 212 may each be open or closed, the total resistance of the low pass filter gain selection circuitry $R_{SELTL}$ between the input signal node INPUT and low pass filter output node LPFOUT is R4. These states are summarized below in Table 1, where "O" represents an open state, "C" represents a closed state, and "X" represents a "do not care" state. A person having ordinary skill in the art will readily understand how selecting between different total resistance of the low pass filter gain selection circuitry $R_{SELTL}$ between the input signal node INPUT and low pass filter output node LPFOUT alters the gain of the low pass filter in the front-end circuit 200. A person having ordinary skill in the art will understand that impedances from the first, second, and third switches SW1 208, SW2 212, and SW3 216 (and other switches for other circuits) can affect an impedance of the filter. However, for ease of discussion herein, the impedances of the switches are assumed to be negligible. Other embodiments can have different configurations of low pass filter gain selection circuitry that can achieve any different gains and/or a different number of possible gains that may be selected.

TABLE 1

| SW1 | SW2 | SW3 | $R_{SELTL}$ |
|-----|-----|-----|-------------|
| O | O | O | R1 + R2 + R3 + R4 |
| C | O | O | R2 + R3 + R4 |
| X | C | O | R3 + R4 |
| X | X | C | R4 |

The frequency response of the front-end circuit 200 can vary based on its configuration. In the illustrated example, the front-end circuit 200 can attenuate low frequency and DC components of an input signal while filtering high frequency components of the input signal. For example, ambient lighting, e.g., indoor lighting and/or outdoor lighting, including sunlight, may cause a photo diode to generate low frequency signal components in the 0 (e.g., DC) to 60 kHz range, and these low frequency signal components may be attenuated by the front-end circuit 200. In some examples, the lower cut off frequency of the front-end circuit 200 is between approximately 100 kHz and 300 kHz, which may further depend on a selected gain stage. Further, front-end circuit 200 filters out high frequency components, such as may result from sharp rising and falling edges of the input signal. In some example implementations, each step in the gain can increase/decrease the gain by 3.5 dB. A person having ordinary skill in the art will readily understand that a frequency response and gain of the front-end circuit 200 can differ based on the implemented configuration and/or values of the various resistors, capacitors, and/or other components.

Figure 3:
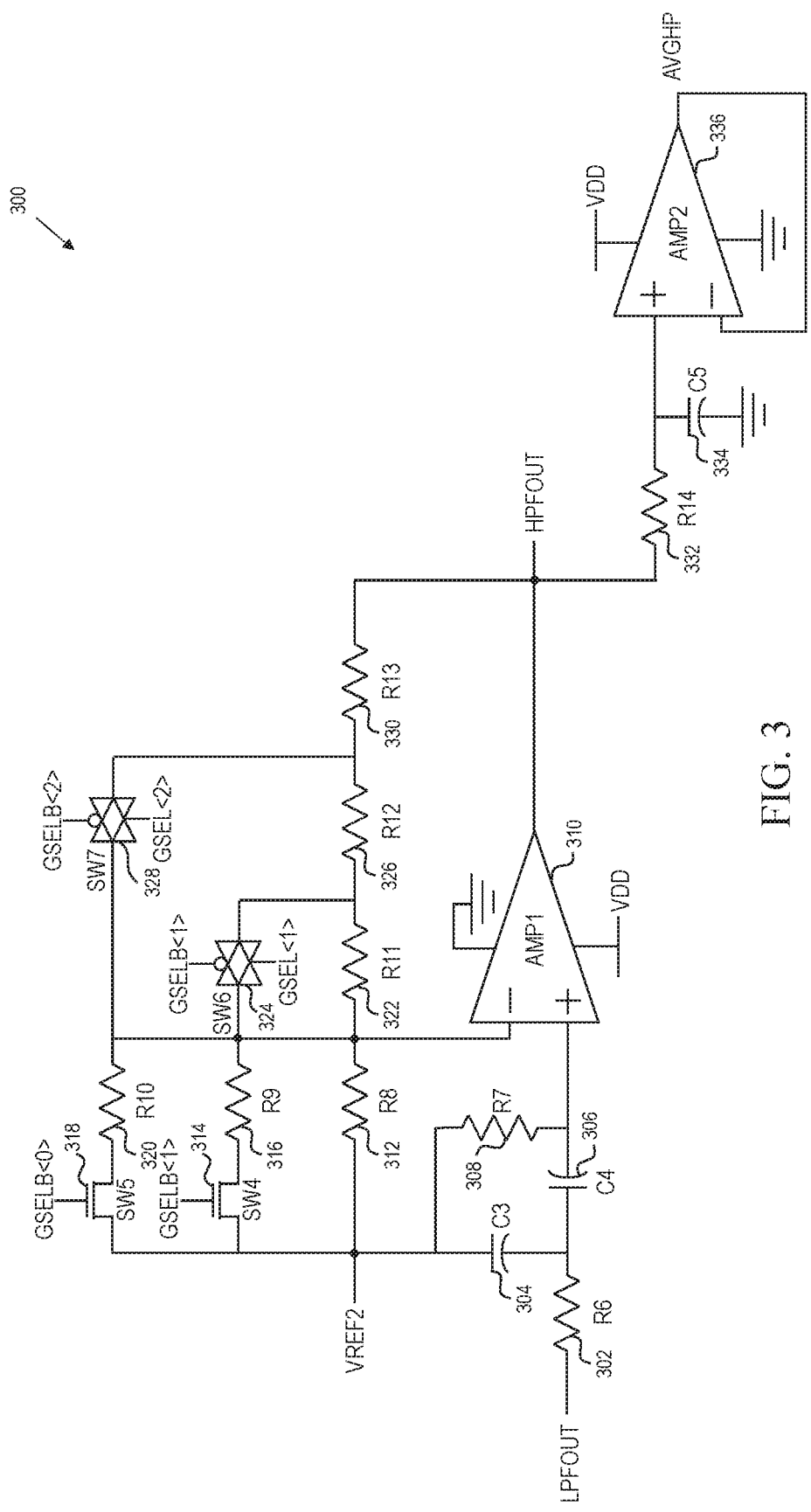
FIG. 3 is an example high pass filter in accordance with some embodiments.

FIG. 3 is an example high pass filter 300 in accordance with some embodiments. In the high pass filter 300, the low pass filter output node LPFOUT is electrically connected to a first terminal of a sixth resistor R6 302. A second terminal of the sixth resistor R6 302 is electrically connected to respective first terminals of a third capacitor C3 304 and a fourth capacitor C4 306. A second terminal of the fourth capacitor C4 306 is electrically connected to a first terminal of a seventh resistor R7 308 and a non-inverting input terminal of a first operational amplifier AMP1 310. Respective second terminals of the third capacitor C3 304 and seventh resistor R7 308 are electrically connected together and to a second reference voltage node VREF2.

First stage high pass filter gain selection circuitry is electrically connected between the second reference voltage node VREF2 and a node electrically connected to the inverting input terminal of the first operational amplifier AMP1 310. The first stage high pass filter gain selection circuitry comprises eighth, ninth, and tenth resistors R8 312, R9 316, and R10 320, respectively, and fourth and fifth switches SW4 314 and SW5 318, respectively. A first terminal of the eighth resistor R8 312 and respective first pass-through terminals of the fourth switch SW4 314 and fifth switch SW5 318 are electrically connected to the second reference voltage node VREF2. A second pass-through terminal of the fourth switch SW4 314 is electrically connected to a first terminal of the ninth resistor R9 316, and a second pass-through terminal of the fifth switch SW5 318 is electrically connected to a first terminal of the tenth resistor R10 320. Respective second terminals of the eighth resistor R8 312, ninth resistor R9 316, and tenth resistor R10 320 are electrically connected to the node electrically connected to the inverting input terminal of the first operational amplifier AMP1 310.

The fourth and fifth switches SW4 314 and SW5 318 can be any type of switch, and in the illustrated example, the fourth and fifth switches SW4 314 and SW5 318 are n-channel field effect transistors (nFETs). Hence, in the illustrated example, high-enabled control input terminals (e.g., gate terminals) of the fourth switch SW4 314 and fifth switch SW5 318 are electrically connected to and controlled to be in open and closed states by respective bits of a complementary gain select signal GSELB<0:1>. The complementary gain select signal first bit node GSELB<0> is electrically connected to the high-enabled control input terminal of the fifth switch SW5 318, and the complementary gain select signal second bit node GSELB<1> is electrically connected to the high-enabled control input terminal of the fourth switch SW4 314.

Second stage high pass filter gain selection circuitry is electrically connected between a high pass filter output node HPFOUT and the node electrically connected to the inverting input terminal of the first operational amplifier AMP1 310. The second stage high pass filter gain selection circuitry comprises eleventh, twelfth, and thirteenth resistors R11 322, R12 326, and R13 330, respectively, and sixth and seventh switches SW6 324 and SW7 328, respectively. A first terminal of the eleventh resistor R11 322 and respective first pass-through terminals of the sixth switch SW6 324 and seventh switch SW7 328 are electrically connected to the node electrically connected to the inverting input terminal of the first operational amplifier AMP1 310. A second terminal of the eleventh resistor R11 322 is electrically connected to a second pass-through terminal of the sixth switch SW6 324 and to a first terminal of the twelfth resistor R12 326. A second terminal of the twelfth resistor R12 326 is electrically connected to a second pass-through terminal of the seventh switch SW7 328 and to a first terminal of the thirteenth resistor R13 330. A second terminal of the thirteenth resistor R13 330 is electrically connected to the high pass filter output node HPFOUT, which is electrically connected to the output terminal of the first operational amplifier AMP1 310 and to a first terminal of a fourteenth resistor R14 332.

A second terminal of the fourteenth resistor R14 332 is electrically connected to a first terminal of a fifth capacitor C5 334 and to a non-inverting input terminal of a second operational amplifier AMP2 336. A second terminal of the fifth capacitor C5 334 is electrically connected to a ground node. An output terminal of the second operational amplifier AMP2 336 is electrically connected to an inverting input terminal of the second operational amplifier AMP2 336 and to an average high pass filter signal node AVGHP.

The sixth and seventh switches SW6 324 and SW7 328 can be any type of switch, and in the illustrated example, the sixth and seventh switches SW6 324 and SW7 328 are transmission gates. Hence, in the illustrated example, the sixth switch SW6 324 and seventh switch SW7 328 are controlled to be in open and closed states by respective signals on gain select signal second through third bit nodes GSEL<1:2> and complementary gain select signal second through third bit nodes GSELB<1:2>. The complementary gain select signal second bit node GSELB<1> is electrically connected to a low-enabled control input terminal of the sixth switch SW6 324, and the gain select signal second bit node GSEL<1> is electrically connected to a high-enabled control input terminal of the sixth switch SW6 324. The complementary gain select signal third bit node GSELB<2> is electrically connected to a low-enabled control input terminal of the seventh switch SW7 328, and the gain select signal third bit node GSEL<2> is electrically connected to a high-enabled control input terminal of the seventh switch SW7 328.

In the configuration of the illustrated example, the high pass filter can have different gains based on the configuration of the first and second stage high pass filter gain selection circuitry. Note that in the illustrated example, the states of the fourth switch SW4 314 and sixth switch SW6 324 are mutually exclusive (e.g., if one is in a closed state, the other is in an open state), although in other implementations, states of various switches may or may not be mutually exclusive. If the fourth switch SW4 314 and fifth switch SW5 318 are open, the total resistance of the first stage high pass filter gain selection circuitry $R_{SELTH1}$ between the second reference voltage node VREF2 and the node electrically connected to the inverting input terminal of the first operational amplifier AMP1 310 is R8. If the fourth switch SW4 314 is closed and the fifth switch SW5 318 is open, the total resistance of the first stage high pass filter gain selection circuitry $R_{SELTH1}$ between the second reference voltage node VREF2 and the node electrically connected to the inverting input terminal of the first operational amplifier AMP1 310 is R8||R9. If the fifth switch SW5 318 is closed and the fourth switch SW4 314 is open, the total resistance of the first stage high pass filter gain selection circuitry $R_{SELTH1}$ between the second reference voltage node VREF2 and the node electrically connected to the inverting input terminal of the first operational amplifier AMP1 310 is R8||R10. If the fourth switch SW4 314 and fifth switch SW5 318 are both closed, the total resistance of the first stage high pass filter gain selection circuitry $R_{SELTH1}$ between the second reference voltage node VREF2 and the node electrically connected to the inverting input terminal of the first operational amplifier AMP1 310 is R8||R9||R10.

If the sixth switch SW6 324 and seventh switch SW7 328 are open, the total resistance of the second stage high pass filter gain selection circuitry $R_{SELTH2}$ between the high pass filter output node HPFOUT and the node electrically connected to the inverting input terminal of the first operational amplifier AMP1 310 is R11+R12+R13. If the sixth switch SW6 324 is closed and the seventh switch SW7 328 is open, the total resistance of the second stage high pass filter gain selection circuitry $R_{SELTH2}$ between the high pass filter output node HPFOUT and the node electrically connected to the inverting input terminal of the first operational amplifier AMP1 310 is R12+R13. If the seventh switch SW7 328 is closed and the sixth switch SW6 324 may be open or closed, the total resistance of the second stage high pass filter gain selection circuitry $R_{SELTH2}$ between the high pass filter output node HPFOUT and the node electrically connected to the inverting input terminal of the first operational amplifier AMP1 310 is R13. These states for the first and second stage high pass filter gain selection circuitry are summarized below in Table 2, where "O" represents an open state, "C" represents a closed state, and "X" represents a "do not care" state. A person having ordinary skill in the art will readily understand how selecting between different total resistances of the first and second stage high pass filter gain selection circuitry between the second reference voltage node VREF2 and high pass filter output node HPFOUT alters the gain of the high pass filter 300. Other embodiments can have different configurations of high pass filter gain selection circuitry that can achieve any different gains and/or a different number of possible gains that may be selected.

TABLE 2

| SW4 | SW5 | SW6 | SW7 | $R_{SELTH1}$ | $R_{SELTH2}$ |
|---|---|---|---|---|---|
| O | O | C | O | R8 | R12 + R13 |
| O | O | X | C | R8 | R13 |
| O | C | C | O | R8‖R10 | R12 + R13 |
| O | C | X | C | R8‖R10 | R13 |
| C | O | O | O | R8‖R9 | R11 + R12 + R13 |
| C | O | X | C | R8‖R9 | R13 |
| C | C | O | O | R8‖R9‖R10 | R11 + R12 + R13 |
| C | C | X | C | R8‖R9‖R10 | R13 |

The frequency response of the high pass filter 300 can vary based on its configuration. In the illustrated example, the high pass filter 300 can remove a DC offset voltage that may be in the signal output from the front-end circuit 200. The high pass filter 300 can have a lower cutoff frequency, such as 1 kHz in some implementations, and an upper cutoff frequency, such as 1.2 MHz in some implementations. In some example implementations, each step in the gain can increase/decrease the gain by 4.5 dB. A person having ordinary skill in the art will readily understand that a frequency response and gain of the high pass filter 300 can differ based on the implemented configuration and/or values of the various resistors, capacitors, and/or other components.

The signal on high pass filter output node HPFOUT is then integrated or averaged to generate an average high pass filter output signal that is input into the non-inverting input terminal of the second operational amplifier AMP2 336. The feedback from the output terminal to the inverting input terminal of the second operational amplifier AMP2 336 provides a unity gain such that the average high pass filter output signal input on the non-inverting input terminal of the second operational amplifier AMP2 336 is provided on the average high pass filter signal node AVGHP.

Figure 4:
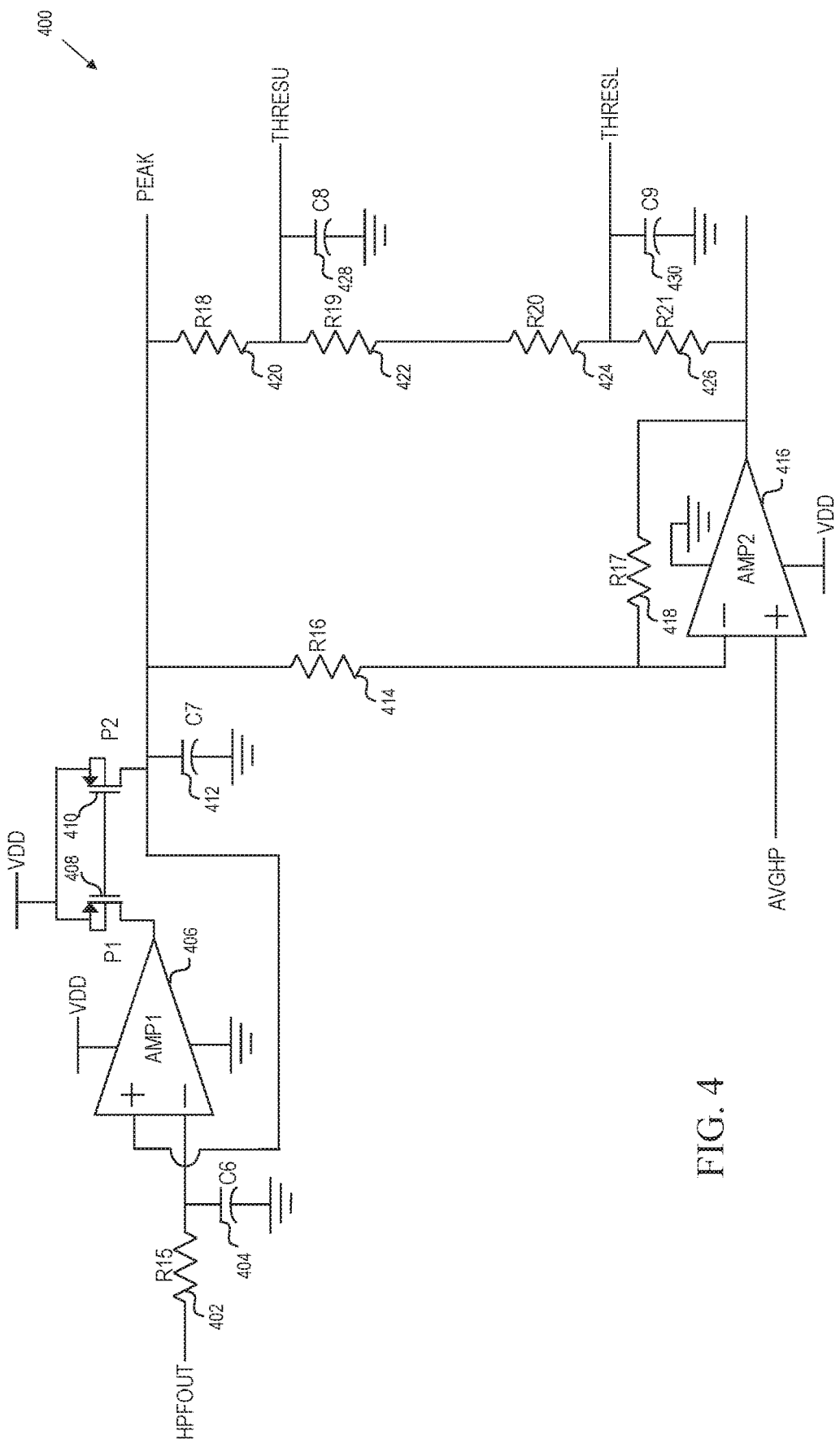
FIG. 4 is an example peak detector in accordance with some embodiments.

FIG. 4 is an example peak detector 400 in accordance with some embodiments. The high pass filter output node HPFOUT is electrically connected to a first terminal of a fifteenth resistor R15 402, and a second terminal of the fifteenth resistor R15 402 is electrically connected to a first terminal of a sixth capacitor C6 404 and an inverting input terminal of a first operational amplifier AMP1 406. A second terminal of the sixth capacitor C6 404 is electrically connected to a ground node.

Respective source and body terminals of a first p-channel field effect transistor (pFET) P1 408 and a second pFET P2 410 are electrically connected to the power supply node VDD, and respective gate terminals of the first pFET P1 408 and second pFET P2 410 are electrically connected together. A drain terminal of the first pFET P1 408 is electrically connected to an output terminal of the first operational amplifier AMP1 406. A drain terminal of the second pFET P2 410 is electrically connected to a peak detect output node PEAK, to a non-inverting input terminal of the first operational amplifier AMP1 406, to respective first terminals of a seventh capacitor C7 412, a sixteenth resistor R16 414, and an eighteenth resistor R18 420. A second terminal of the seventh capacitor C7 412 is electrically connected to a ground node.

A second terminal of the sixteenth resistor R16 414 is electrically connected to an inverting input terminal of a second operational amplifier AMP2 416 and to a first terminal of a seventeenth resistor R17 418. The average high pass filter signal node AVGHP is electrically connected to a non-inverting input terminal of the second operational amplifier AMP2 416. A second terminal of the seventeenth resistor R17 418 is electrically connected to an output terminal of the second operational amplifier AMP2 416.

A second terminal of the eighteenth resistor R18 420 is electrically connected to an upper threshold node THRESU, which is further electrically connected to respective first terminals of a nineteenth resistor R19 422 and an eighth capacitor C8 428. A second terminal of the eighth capacitor C8 428 is electrically connected to a ground node. A second terminal of the nineteenth resistor R19 422 is electrically connected to a first terminal of a twentieth resistor R20 424. A second terminal of the twentieth resistor R20 424 is electrically connected to a lower threshold node THRESL, which is further electrically connected to respective first terminals of a twenty-first resistor R21 426 and a ninth capacitor C9 430. A second terminal of the twenty-first resistor R21 426 is electrically connected to the output terminal of the second operational amplifier AMP2 416, and a second terminal of the ninth capacitor C9 430 is electrically connected to a ground node.

The peak detector 400 receives the high pass filter output signal via the high pass filter output node HPFOUT, and integrates or averages the high pass filter output signal to obtain an average high pass filter signal on the inverting input terminal of the first operational amplifier AMP1 406. When the voltage on the inverting input terminal of the first operational amplifier AMP1 406 is greater than the peak voltage $V_P$ on the peak detect output node PEAK, the output at the output terminal of the first operational amplifier AMP1 406 is low, which causes a voltage drop across the first pFET P1 408. The current mirror configuration of the first pFET P1 408 and second pFET P2 410 causes the seventh capacitor C7 412 to charge to obtain the peak voltage $V_P$ on the peak detect output node PEAK. When the voltage on the inverting input terminal of the first operational amplifier AMP1 406 is less than the peak voltage $V_P$ on the peak detect output node PEAK, the output at the output terminal of the first operational amplifier AMP1 406 is high, which reduces or removes a voltage drop across the first pFET P1 408, and charge on the seventh capacitor C7 412 is dissipated through the resistor network to obtain the peak voltage $V_P$ on the peak detect output node PEAK. Hence, the peak voltage $V_P$ on the peak detect output node PEAK can correspond to the high pass filter output signal via the high pass filter output node HPFOUT. For example, the peak voltage $V_P$ on the peak detect output node PEAK can be proportional to the high pass filter output signal.

In some examples, the seventh capacitor C7 412 outputs the peak voltage $V_P$ on peak detect output node PEAK that follows the peak of the signal on high pass filter output node HPFOUT and then decays at some rate, which in some instances can be 50% every 10 ms. The rate of decay can be chosen to accommodate a low frequency signal, such as 150 Hz. Further, the peak detector 400 can set the signals $V_{THRESU}$ and $V_{THRESL}$ on upper threshold node THRESU and lower threshold node THRESL, respectively, as some percentage of the peak voltage $V_P$ on peak detect output node PEAK, such as 50%. By setting an appropriate percentage, the occurrence of false output signals on output signal node OUTPUT due to noise can be minimized and/or avoided.

Figure 5:
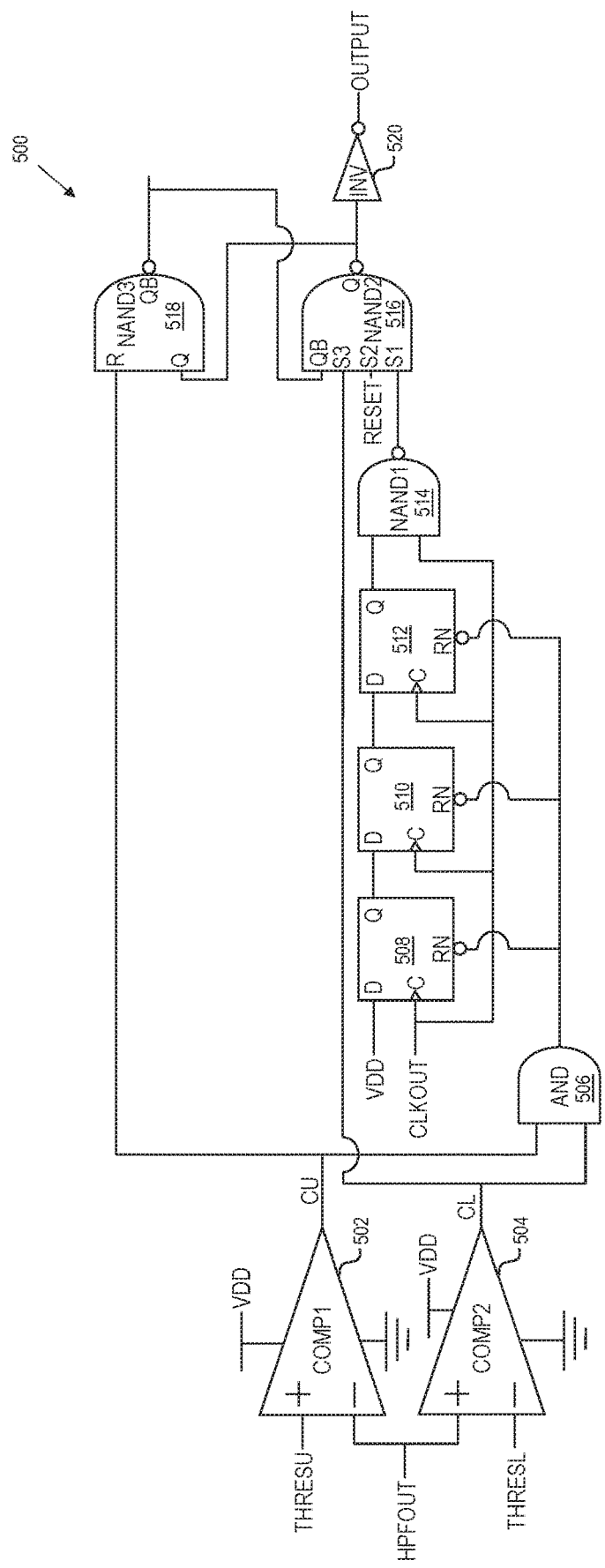
FIG. 5 is an example comparator and output driver in accordance with some embodiments.

FIG. 5 illustrates an example comparator and output driver 500 in accordance with some embodiments. The comparator includes a first comparator COMP1 502 and a second comparator COMP2 504. The high pass filter output node HPFOUT is electrically connected to an inverting input terminal of the first comparator COMP1 502 and to a non-inverting input terminal of the second comparator COMP2 504. The upper threshold node THRESU is electrically connected to a non-inverting input terminal of the first comparator COMP1 502, and the lower threshold node THRESL is electrically connected to an inverting input terminal of the second comparator COMP2 504. An output terminal of the first comparator COMP1 502 is electrically connected to an upper channel node CU, and an output terminal of the second comparator COMP2 504 is electrically connected to a lower channel node CL.

The output driver circuit includes cascaded D flip-flops, including first, second, and third D flip-flops 508, 510, and 512, respectively. A data input terminal D of the first D flip-flop 508 is electrically connected to the power supply node VDD. An output terminal Q of the first D flip-flop 508 is electrically connected to a data input terminal D of the second D flip-flop 510. An output terminal Q of the second D flip-flop 510 is electrically connected to a data input terminal D of the third D flip-flop 512. Respective clock input terminals C of the first D flip-flop 508, second D flip-flop 510, and third D flip-flop 512 are electrically connected to an output clock node CLKOUT. The upper channel node CU and lower channel node CL are electrically connected to first and second input terminals of an AND gate AND 506, respectively, and an output terminal of the AND gate AND 506 is electrically connected to respective reset input terminals RN of the first D flip-flop 508, second D flip-flop 510, and third D flip-flop 512.

An output terminal Q of the third D flip-flop 512 and the output clock node CLKOUT are electrically connected to respective input terminals of a first NAND gate NAND1 514. An output terminal of the first NAND gate NAND1 514 is electrically connected to a first input terminal S1 of a second NAND gate NAND2 516. A reset node RESET and the lower channel node CL are electrically connected to a second input terminal S2 and a third input terminal S3, respectively, of the second NAND gate NAND2 516. An output terminal QB of a third NAND gate NAND3 518 is electrically connected to a fourth input terminal QB of the second NAND gate NAND2 516. An output terminal Q of the second NAND gate NAND2 516 is electrically connected to an input terminal of an inverter INV 520 and to a first input terminal Q of the third NAND gate NAND3 518. The upper channel node CU is electrically connected to a second input terminal R of the third NAND gate NAND3 518. The output terminal of the inverter INV 520 is electrically connected to an output signal node OUTPUT.

The second NAND gate NAND2 516 and third NAND gate NAND3 518 operate as a latch in the configuration illustrated in FIG. 5. For convenience, a truth table of the latch is shown in Table 3 below.

TABLE 3

| S1 | S2 | S3 | R | Q+ | QB+ |
|----|----|----|---|----|-----|
| 0  | 0  | 0  | 1 | 1  | 0   |
| 0  | 0  | 1  |   |    |     |
| 0  | 1  | 0  |   |    |     |
| 0  | 1  | 1  |   |    |     |
| 1  | 0  | 0  |   |    |     |
| 1  | 0  | 1  |   |    |     |
| 1  | 1  | 0  |   |    |     |
| 1  | 1  | 1  | 0 | 0  | 1   |
|    |    |    | 1 | Q  | QB  |

Further, for convenience, a truth table of the first, second, and third D flip-flops 508, 510, and 512 is shown in Table 4 below.

TABLE 4

| D | C           | RN | Q |
|---|-------------|----|---|
| 0 | Rising Edge | 1  | 0 |
| 1 | Rising Edge | 1  | 1 |
| X | Rising Edge | 0  | 0 |

To illustrate the operation of FIG. 5, assume that the high pass filter output voltage $V_{HOUT}$ on high pass filter output node HPFOUT is less than an upper threshold voltage $V_{THRESU}$ on the upper threshold node THRESU and greater than a lower threshold voltage $V_{THRESL}$ on the lower threshold node THRESL and that the output signal on the output signal node OUTPUT is a logical low. Also, assume that the signal on the reset node RESET remains a logical high. If the signal on the reset node RESET becomes a logical low, the output signal on the output terminal Q of the second NAND gate NAND2 516 goes to a logical high, which causes the output signal on the output signal node OUTPUT to go to a logical low, after the output signal on the output terminal Q of the second NAND gate NAND2 516 is inverted by the inverter INV 520.

Then, assume that the $V_{HOUT}$ becomes greater than $V_{THRESU}$. The upper channel node CU becomes logical low, which resets the latch such that the output terminal Q of the second NAND gate NAND2 516 is logical low. The low signal on the output terminal Q of the second NAND gate NAND2 516 is inverted by the inverter INV 520 to a logical high, which is output on the output signal node OUTPUT. The output on the output signal node OUTPUT remains in this state while the $V_{HOUT}$ is greater than $V_{THRESU}$. Additionally, in this state, the output signal on the output terminal of the AND gate AND 506 is a logical low (since the upper channel node CU is logical low), which resets the output signals on the output terminals Q of the first D flip-flop 508, second D flip-flop 510, and third D flip-flop 512 to a logical low.

Next, assume that the $V_{HOUT}$ returns to being less than $V_{THRESU}$ and greater than $V_{THRESL}$. In this state, the upper channel node CU, lower channel node CL, and output terminal of the AND gate AND 506 are logical high. As long as this remains true, the output signal on the output terminal of the first NAND gate NAND1 514 determines the output signal on the output signal node OUTPUT. If the output signal on the output terminal of the first NAND gate NAND1 514 is a logical high, the output signal on the output signal node OUTPUT retains its previous state, and if the output signal on the output terminal of the first NAND gate NAND1 514 is a logical low, the output signal on the output terminal Q of the second NAND gate NAND2 516 becomes a logical high, which causes the output signal on the output signal node OUTPUT to become a logical low.

Since the output signals on the output terminals Q of the first D flip-flop 508, second D flip-flop 510, and third D flip-flop 512 were previously reset to a logical low, the output signal on the output terminal Q of the third D flip-flop 512 (which is input into the input terminal of the first NAND gate NAND1 514) remains a logical low (hence, the output signal on the output terminal of the first NAND gate NAND1 514 remains a logical high) until the logical high (e.g., VDD) is propagated to the output terminals Q of the first D flip-flop 508, second D flip-flop 510, and third D flip-flop 512 after a sufficient number of rising edges on the output clock node CLKOUT occur. Once the logical high propagates to the output terminal Q of the third D flip-flop 512, and when a logical high on the output clock node CLKOUT occurs, the output signal on the output terminal of the first NAND gate NAND1 514 becomes a logical low, which causes the output signal on the output terminal Q of the second NAND gate NAND2 516 to become a logical high, which causes the output signal on the output signal node OUTPUT to become a logical low. After this point, as long as upper channel node CU and lower channel node CL remain logical high, the output signal on the output signal node OUTPUT remains a logical low, since the toggling of the signal on the output clock node CLKOUT causes the output signal on the output signal node OUTPUT to retain its previous state or to drive the output signal to a logical low.

Next, assume that the $V_{HOUT}$ becomes less than $V_{THRESU}$ and $V_{THRESL}$. The lower channel node CL becomes logical low, which sets the latch such that the output terminal Q of the second NAND gate NAND2 516 is logical high. The logical high signal on the output terminal Q of the second NAND gate NAND2 516 is inverted by the inverter INV 520 to a logical low, which is output on the output signal node OUTPUT. The output on the output signal node OUTPUT remains in this state while the $V_{HOUT}$ is less than $V_{THRESL}$. Note that the output signal on the output signal node OUTPUT is driven to logical low when $V_{HOUT}$ becomes less than $V_{THRESU}$ and $V_{THRESL}$ regardless of the states of the first D flip-flop 508, second D flip-flop 510, and third D flip-flop 512 since the logical low signal on the lower channel node CL can cause the output signal on the output signal node OUTPUT to be driven to a logical low. Hence, even if a logical high has not been propagated through the first D flip-flop 508, second D flip-flop 510, and third D flip-flop 512 as previously described, the output signal on the output signal node OUTPUT can still be driven to a logical low. Additionally, in this state, the output signal on the output terminal of the AND gate AND 506 is a logical low (since the upper channel node CU is logical low), which resets the output signals on the output terminals Q of the first D flip-flop 508, second D flip-flop 510, and third D flip-flop 512 to a logical low.

Next, assume that the $V_{HOUT}$ returns to being less than $V_{THRESU}$ and greater than $V_{THRESL}$. In this state, the upper channel node CU, lower channel node CL, and output terminal of the AND gate AND 506 are logical high. The logic operates in the same manner as previously described under these conditions. However, since the output terminal Q of the second NAND gate NAND2 516 is at a logical high and the output signal on the output signal node OUTPUT is a logical low upon entering this state, the logic permits the output signal on the output signal node OUTPUT to remain in its previous state (e.g., logical low in this instance) or to drive the output signal on the output signal node OUTPUT to a logical low. Hence, the functionality of the first D flip-flop 508, second D flip-flop 510, and third D flip-flop 512 do not have an effect on the logic state of the output signal on the output signal node OUTPUT under these circumstances.

Figure 6:
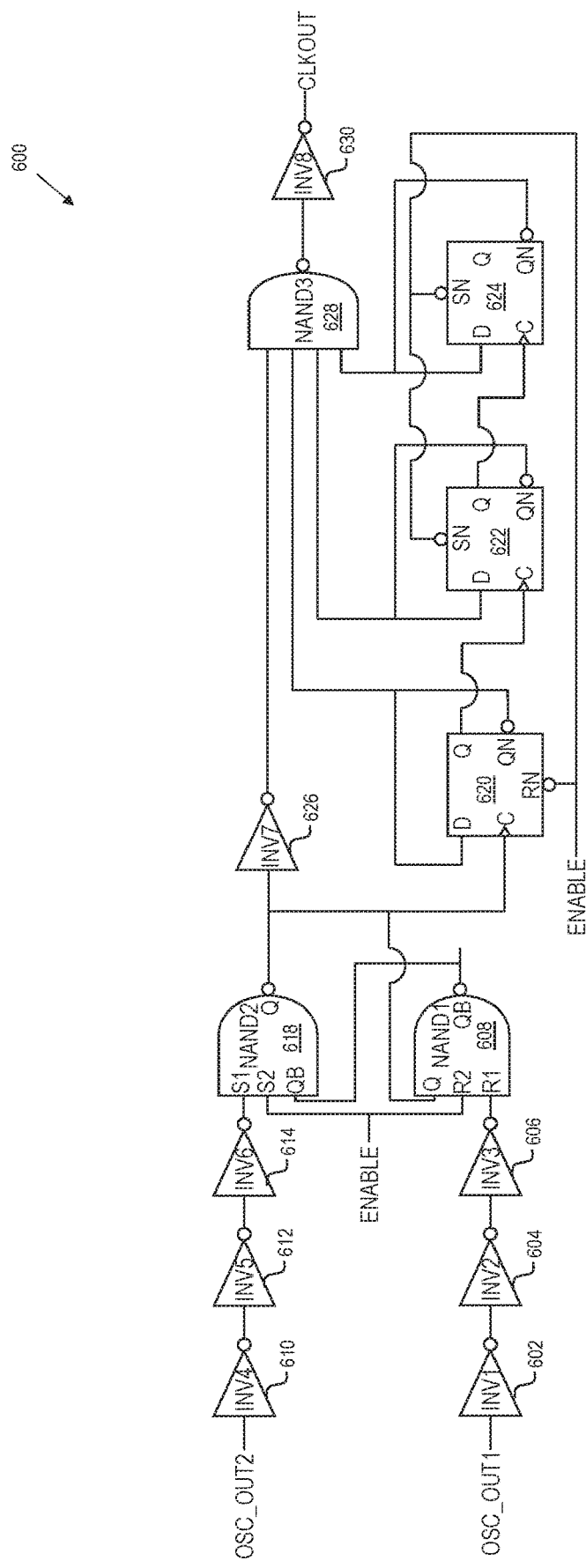
FIG. 6 is an example clock generator in accordance with some embodiments.

FIG. 6 illustrates an example clock generator 600 in accordance with some embodiments. Although not specifically illustrated, the clock generator 600 includes local oscillator circuits, each of which can be any appropriate local oscillator circuit, that generate respective output signals on first local oscillator output node OSC_OUT1 and second local oscillator output node OSC_OUT2. The first local oscillator output node OSC_OUT1 is electrically connected to an input terminal of a first inverter INV1 602. An output terminal of the first inverter INV1 602 is electrically connected to an input terminal of a second inverter INV2 604, and an output terminal of the second inverter INV2 604 is electrically connected to an input terminal of a third inverter INV3 606. An output terminal of the third inverter INV3 606 is electrically connected to a first input terminal R1 of a first NAND gate NAND1 608. The second local oscillator output node OSC_OUT2 is electrically connected to an input terminal of a fourth inverter INV4 610. An output terminal of the fourth inverter INV4 610 is electrically connected to an input terminal of a fifth inverter INV5 612, and an output terminal of the fifth inverter INV5 612 is electrically connected to an input terminal of a sixth inverter INV6 614. An output terminal of the sixth inverter INV6 614 is electrically connected to a first input terminal S1 of a second NAND gate NAND2 618. Respective second input terminals R2 and S2 of the first NAND gate NAND1 608 and second NAND gate NAND2 618 are electrically connected to an enable signal node ENABLE. An output terminal QB of the first NAND gate NAND1 608 is electrically connected to a third input terminal QB of the second NAND gate NAND2 618, and an output terminal Q of the second NAND gate NAND2 618 is electrically connected to a third input terminal Q of the first NAND gate NAND1 608. The output terminal Q of the second NAND gate NAND2 618 is electrically connected to an input terminal of a seventh inverter INV7 626, and an output terminal of the seventh inverter INV7 626 is electrically connected to a first input terminal of a third NAND gate NAND3 628.

The output terminal Q of the second NAND gate NAND2 618 is further electrically connected to a clock input terminal C of a first D flip-flop 620. The output terminal Q of the first D flip-flop 620 is electrically connected to a clock input terminal C of a second D flip-flop 622. The output terminal Q of the second D flip-flop 622 is electrically connected to a clock input terminal C of a third D flip-flop 624. The complementary output terminal QN of the first D flip-flop 620 is electrically connected to a data input terminal D of the first D flip-flop 620 and to a second input terminal of a third NAND gate NAND3 628. The complementary output terminal QN of the second D flip-flop 622 is electrically connected to a data input terminal D of the second D flip-flop 622 and to a third input terminal of a third NAND gate NAND3 628. The complementary output terminal QN of the third D flip-flop 624 is electrically connected to a data input terminal D of the third D flip-flop 624 and to a fourth input terminal of a third NAND gate NAND3 628. The enable signal node ENABLE is electrically connected to a reset input terminal RN of the first D flip-flop 620 and to respective set input terminals SN of the second D flip-flop 622 and third D flip-flop 624.

An output terminal of the third NAND gate NAND3 628 is electrically connected to an input terminal of an eighth inverter INV8 630, and an output terminal of the eighth inverter INV8 630 is electrically connected to the output clock node CLKOUT. The local oscillator circuits may be configured to generate respective output signals on first local oscillator output node OSC_OUT1 and second local oscillator output node OSC_OUT2 to cause an appropriate duty cycle of a clock signal to be generated and output on the output clock node CLKOUT.

The first NAND gate NAND1 608 and second NAND gate NAND2 618 operate as a latch in the configuration illustrated in FIG. 6. For convenience, assuming that the signal on the enable signal node ENABLE is a logical high, a truth table of the latch is shown in Table 5 below. If the signal on enable signal node ENABLE is a logical low, the output terminal Q of the second NAND gate NAND2 618 is at a logical high.

TABLE 5

| S1 | R2 | Q+ | QB+ |
|---|---|---|---|
| 0 | 1 | 1 | 0 |
| 1 | 0 | 0 | 1 |
| 1 | 1 | Q | QB |

Further, for convenience, a truth table of the first D flip-flop 620 is shown in Table 6 below.

TABLE 6

| D | C | RN | Q | QB |
|---|---|---|---|---|
| 0 | Rising Edge | 1 | 0 | 1 |
| 1 | Rising Edge | 1 | 1 | 0 |
| X | Rising Edge | 0 | 0 | 1 |

Also, for convenience, a truth table of the second D flip-flop 622 and third D flip-flop 624 is shown in Table 7 below.

TABLE 7

| D | C | SN | Q | QB |
|---|---|---|---|---|
| 0 | Rising Edge | 1 | 0 | 1 |
| 1 | Rising Edge | 1 | 1 | 0 |
| X | Rising Edge | 0 | 1 | 0 |

In some embodiments, the signals on the first local oscillator output node OSC_OUT1 and second local oscillator output node OSC_OUT2 can have any frequency with any signal shape, including pulse width. In some specific implementations, the signals on the first local oscillator output node OSC_OUT1 and second local oscillator output node OSC_OUT2 are phase offset with frequencies of approximately 591 Hz. As a result of respective inverter chains, the signals input to the respective first input terminals R1 and S1 of the first NAND gate NAND1 608 and second NAND gate NAND2 618 are normally a logical high with pulses dropping to a logical low. If the signal on enable signal node ENABLE remains a logical high, the logical low pulses change the state of the signal on the output terminal Q of the second NAND gate NAND2 618, and states of the signal on the output terminal Q of the second NAND gate NAND2 618 remain latched between pulses. If the signal on enable signal node ENABLE is a logical low, the signal on the output terminal Q of the second NAND gate NAND2 618 becomes a logical high.

Assuming that the signal on enable signal node ENABLE is first a logical low, the output terminal Q of the first D flip-flop 620 is reset to a logical low, and the output terminals Q of the second D flip-flop 622 and third D flip-flop 624 are set to a logical high. The complementary output terminals QN of the flip-flops are set to a complementary logical value of its respective output terminal Q.

Once the signal on enable signal node ENABLE becomes a logical high, the output terminal Q of the first D flip-flop 620 switches to a logical high at the rising edge of the output signal on the output terminal Q of the second NAND gate NAND2 618 because the complementary output terminal QN of the first D flip-flop 620 is fed back to the data input terminal D of the first D flip-flop 620, and the output terminal Q of the first D flip-flop 620 thereafter continues to toggle between a logical high and logical low (because the complementary output terminal QN is feedback to the data input terminal D) at rising edges of the signal on the output terminal Q of the second NAND gate NAND2 618 as long as the signal on the enable signal node ENABLE is a logical high. This causes the signal on the output terminal Q of the first D flip-flop 620 to effectively be a clock signal having a frequency that is half of the frequency of the signal on the output terminal Q of the second NAND gate NAND2 618.

Similarly, the output terminal Q of the second D flip-flop 622 switches to a logical low at the rising edge of the output signal on the output terminal Q of the first D flip-flop 620 because the complementary output terminal QN of the second D flip-flop 622 is fed back to the data input terminal D of the second D flip-flop 622, and the output terminal Q of the second D flip-flop 622 thereafter continues to toggle between a logical high and logical low (because the complementary output terminal QN is feedback to the data input terminal D) at rising edges of the signal on the output terminal Q of the first D flip-flop 620 as long as the signal on the enable signal node ENABLE is a logical high. This causes the signal on the output terminal Q of the second D flip-flop 622 to effectively be a clock signal having a frequency that is half of the frequency of the signal on the output terminal Q of the first D flip-flop 620.

Further, the output terminal Q of the third D flip-flop 624 switches to a logical low at the rising edge of the output signal on the output terminal Q of the second D flip-flop 622 because the complementary output terminal QN of the third D flip-flop 624 is fed back to the data input terminal D of the third D flip-flop 624, and the output terminal Q of the third D flip-flop 624 thereafter continues to toggle between a logical high and logical low (because the complementary output terminal QN is feedback to the data input terminal D) at rising edges of the signal on the output terminal Q of the second D flip-flop 622 as long as the signal on the enable signal node ENABLE is a logical high. This causes the signal on the output terminal Q of the third D flip-flop 624 to effectively be a clock signal having a frequency that is half of the frequency of the signal on the output terminal Q of the second D flip-flop 622.

The signal on the output terminal Q of the second NAND gate NAND2 618 is inverted by the seventh inverter INV7 626 and input into the third NAND gate NAND3 628. The signals on the complementary output terminals QN of the first D flip-flop 620, second D flip-flop 622, and third D flip-flop 624 are also input into the third NAND gate NAND3 628. When the signal on enable signal node ENABLE is a logical high, the signal that is output on the output terminal of the eighth inverter INV8 630 as a result of inverting the signal on the output terminal of the third NAND gate NAND3 628 is a clock signal having a frequency that is one-eighth of the frequency of the signal on the output terminal Q of the second NAND gate NAND2 618 with a duty cycle equal to the duty cycle of the signal on the output terminal Q of the second NAND gate NAND2 618. For example, in some embodiments, the clock signal can have a frequency of approximately 70 Hz (e.g., about 73 Hz when the frequency on first local oscillator output node OSC_OUT1 and second local oscillator output node OSC_OUT2 is about 591 Hz).

Figure 7A:
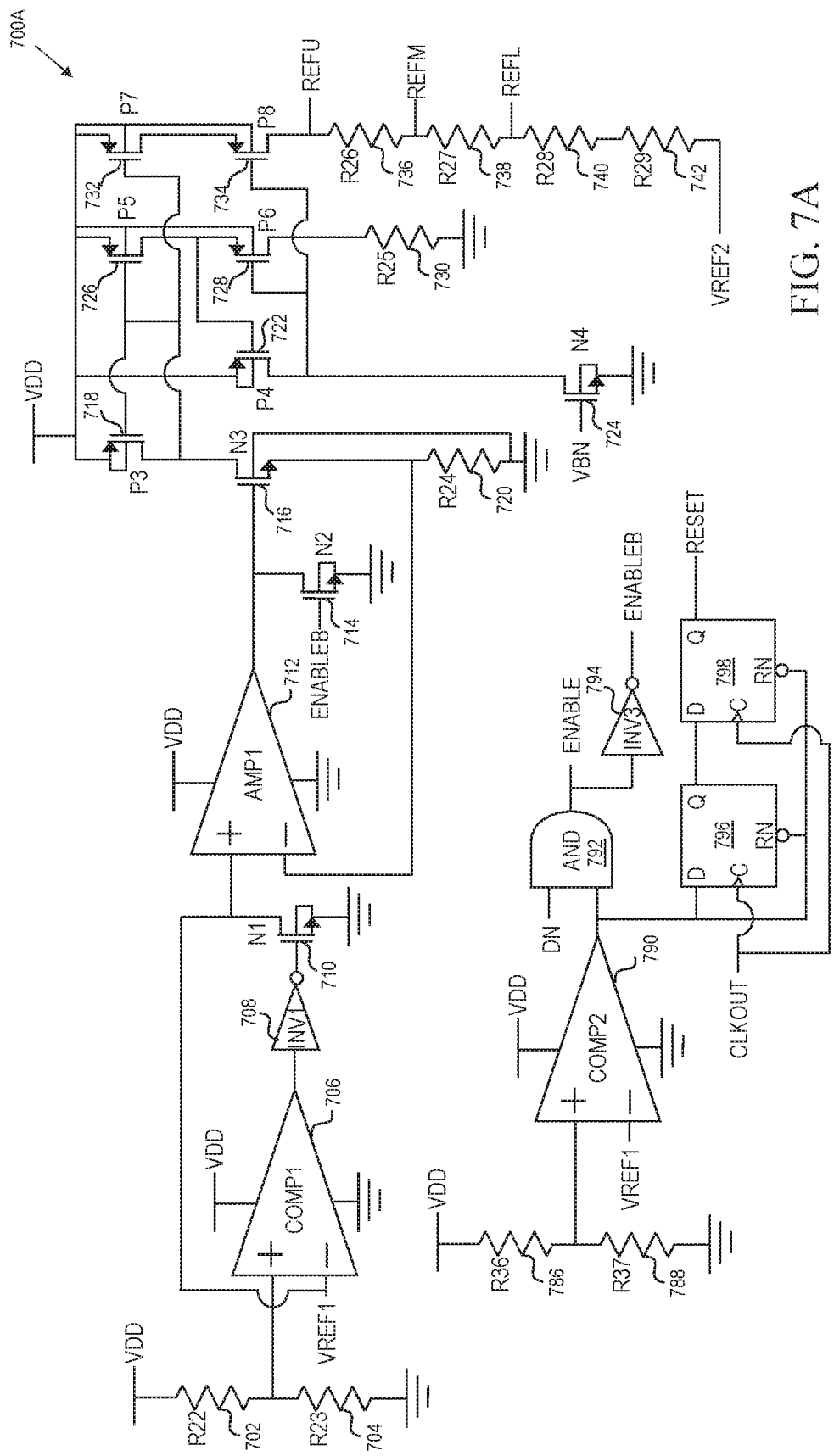
FIGS. 7A and 7B are an example reference voltage and control circuit in accordance with some embodiments.
Figure 7B:
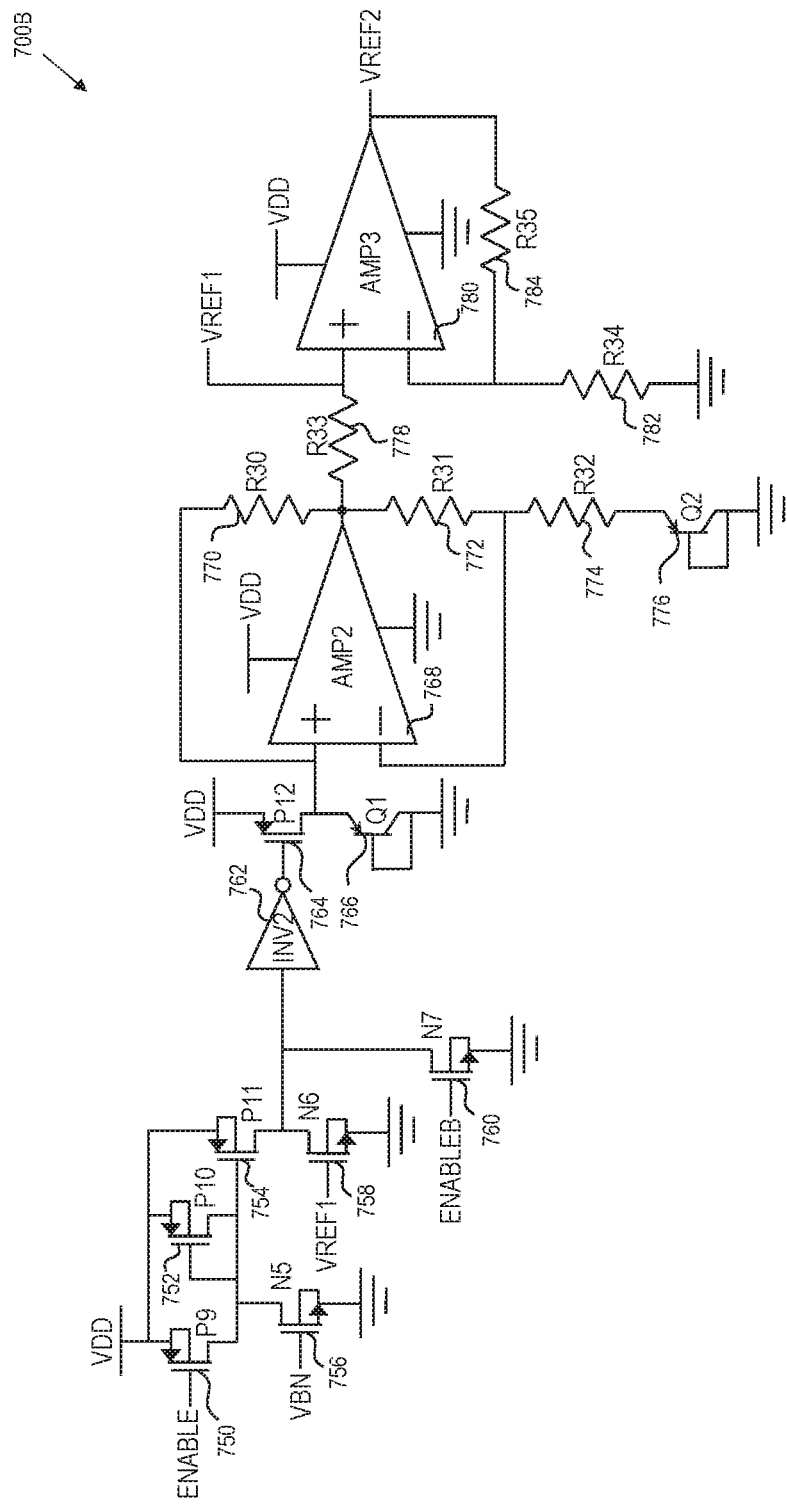

FIGS. 7A and 7B illustrate an example reference voltage and control circuit 700A and 700B in accordance with some embodiments. Referring first to FIG. 7A, a first terminal of a twenty-second resistor R22 702 is electrically connected to the power supply node VDD. A second terminal of the twenty-second resistor R22 702 is electrically connected to a non-inverting input terminal of a first comparator COMP1 706 and to a first terminal of a twenty-third resistor R23 704. A second terminal of the twenty-third resistor R23 704 is electrically connected to a ground node. The first reference voltage node VREF1 is electrically connected to an inverting input terminal of the first comparator COMP1 706, to a drain terminal of a first nFET N1 710, and to a non-inverting input terminal of a first operational amplifier AMP1 712. An output terminal of the first comparator COMP1 706 is electrically connected to an input terminal of a first inverter INV1 708, and an output terminal of the first inverter INV1 708 is electrically connected to a gate terminal of the first nFET N1 710. Source and body terminals of the first nFET N1 710 are electrically connected to a ground node.

An output terminal of the first operational amplifier AMP1 712 is electrically connected to a drain terminal of a second nFET N2 714 and to a gate terminal of a third nFET N3 716. A gate terminal of the second nFET N2 714 is electrically connected to a complementary enable signal node ENABLEB, and source and body terminals of the second nFET N2 714 are electrically connected to a ground node. A source terminal of the third nFET N3 716 is electrically connected to a first terminal of a twenty-fourth resistor R24 720 and to an inverting input terminal of the first operational amplifier AMP1 712. A body terminal of the third nFET N3 716 and a second terminal of the twenty-fourth resistor R24 720 are electrically connected to a ground node.

The power supply node VDD is electrically connected to respective source and body terminals of third, fourth, fifth and seventh pFETs P3 718, P4 722, P5 726, and P7 732, respectively. A drain terminal of the third pFET P3 718 is electrically connected to a drain terminal of the third nFET N3 716 and to respective gate terminals of the third pFET P3 718, fifth pFET P5 726, and seventh pFET P7 732. A drain terminal of the fifth pFET P5 726 is electrically connected to a source terminal of a sixth pFET P6 728 and to a gate terminal of the fourth pFET P4 722, and a body terminal of the sixth pFET P6 728 is electrically connected to the power supply node VDD. A drain terminal of the seventh pFET P7 732 is electrically connected to a source terminal of an eighth pFET P8 734, and a body terminal of the eighth pFET P8 734 is electrically connected to the power supply node VDD. A drain terminal of the fourth pFET P4 722 is electrically connected to a drain terminal of a fourth nFET N4 724 and to respective gate terminals of the sixth pFET P6 728 and eighth pFET P8 734. Source and body terminals of the fourth nFET N4 724 are electrically connected to a ground node, and a gate terminal of the fourth nFET N4 724 is electrically connected to a bias voltage node VBN. The voltage on the bias voltage node VBN can be generated by any appropriate circuitry to a voltage level appropriate for a design. A drain terminal of the sixth pFET P6 728 is electrically connected to a first terminal of a twenty-fifth resistor R25 730, and a second terminal of the twenty-fifth resistor R25 730 is electrically connected to a ground node. A drain terminal of the eighth pFET P8 734 is electrically connected to a first terminal of a twenty-sixth resistor R26 736 and to an upper voltage reference node REFU. A second terminal of the twenty-sixth resistor R26 736 is electrically connected to a first terminal of a twenty-seventh resistor R27 738 and to a middle voltage reference node REFM. A second terminal of the twenty-seventh resistor R27 738 is electrically connected to a first terminal of a twenty-eighth resistor R28 740 and to a lower voltage reference node REFL. A second terminal of the twenty-eighth resistor R28 740 is electrically connected to a first terminal of a twenty-ninth resistor R29 742, and a second terminal of the twenty-ninth resistor R29 742 is electrically connected to the second reference voltage node VREF2.

Referring now to FIG. 7B, respective source terminals and body terminals of a ninth pFET P9 750, a tenth pFET P10 752, and an eleventh pFET P11 754 are electrically connected to the power supply node VDD. A gate terminal of the ninth pFET P9 750 is electrically connected to the enable signal node ENABLE. A drain terminal of the ninth pFET P9 750 is electrically connected to a drain terminal of a fifth nFET N5 756, to gate and drain terminals of the tenth pFET P10 752, and to a gate terminal of the eleventh pFET P11 754. A gate terminal of the fifth nFET N5 756 is electrically connected to the bias voltage node VBN, and source and body terminals of the fifth nFET N5 756 are electrically connected to a ground node. A drain terminal of the eleventh pFET P11 754 is electrically connected to respective drain terminals of a sixth nFET N6 758 and a seventh nFET N7 760 and to an input terminal of a second inverter INV2 762. Respective source and body terminals of the sixth nFET N6 758 and seventh nFET N7 760 are electrically connected to a ground node. A gate terminal of the sixth nFET N6 758 is electrically connected to the first reference voltage node VREF1, and a gate terminal of the seventh nFET N7 760 is electrically connected to the complementary enable signal node ENABLEB.

An output terminal of the second inverter INV2 762 is electrically connected to a gate terminal of a twelfth pFET P12 764. A source terminal of a twelfth pFET P12 764 is electrically connected to the power supply node VDD, and a drain terminal of the twelfth pFET P12 764 is electrically connected to an emitter terminal of a first PNP BJT Q1 766, to a non-inverting input terminal of a second operational amplifier AMP2 768, and to a first terminal of a thirtieth resistor R30 770. Base and collector terminals of the first PNP BJT Q1 766 are electrically connected to a ground node (e.g., connected as a diode). A second terminal of the thirtieth resistor R30 770 is electrically connected to an output terminal of the second operational amplifier AMP2 768 and to respective first terminals of a thirty-first resistor R31 772 and a thirty-third resistor R33 778. A second terminal of the thirty-first resistor R31 772 is electrically connected to an inverting input terminal of the second operational amplifier AMP2 768 and to a first terminal of a thirty-second resistor R32 774. A second terminal of the thirty-second resistor R32 774 is electrically connected to an emitter terminal of a second PNP BJT Q2 776, and base and collector terminals of the second PNP BJT Q2 776 are electrically connected to a ground node (e.g., connected as a diode).

A second terminal of the thirty-third resistor R33 778 is electrically connected to the first reference voltage node VREF1 and to a non-inverting input terminal of a third operational amplifier AMP3 780. An inverting input terminal of the third operational amplifier AMP3 780 is electrically connected to respective first terminals of a thirty-fourth resistor R34 782 and a thirty-fifth resistor R35 784. A second terminal of the thirty-fourth resistor R34 782 is electrically connected to a ground node, and a second terminal of the thirty-fifth resistor R35 784 is electrically connected to an output terminal of the third operational amplifier AMP3 780 and to the second reference voltage node VREF2.

Referring back to FIG. 7A, a first terminal of a thirty-sixth resistor R36 786 is electrically connected to the power supply node VDD, and a second terminal of the thirty-sixth resistor R36 786 is electrically connected to a first terminal of a thirty-seventh resistor R37 788 and to a non-inverting input terminal of a second comparator COMP2 790. A second terminal of the thirty-seventh resistor R37 788 is electrically connected to a ground node. The first reference voltage node VREF1 is electrically connected to an inverting input terminal of the second comparator COMP2 790. An output terminal of the second comparator COMP2 790 is electrically connected to a first input terminal of an AND gate AND 792. A down signal indication node DN is electrically connected to a second input terminal of the AND gate AND 792. An output terminal of the AND gate AND 792 is electrically connected to the enable signal node ENABLE and to an input terminal of a third inverter INV3 794, and an output terminal of the third inverter INV3 794 is electrically connected to the complementary enable signal node ENABLEB.

As described below with respect to FIGS. 8A and 8B, the signal on down signal indication node DN is a logical high when the lower reference voltage $V_{RL}$ on lower voltage reference node REFL is greater than the peak voltage $V_P$ on peak detect output node PEAK. Hence, when $V_{RL} > V_P$ and the output signal on the output terminal of the second comparator COMP2 790 is a logical high, the signal on enable signal node ENABLE is a logical high, and the signal on complementary enable signal node ENABLEB is a logical low. Conversely, when $V_{RL} < V_P$ or the output signal on the output terminal of the second comparator COMP2 790 is a logical low, the signal on enable signal node ENABLE is a logical low, and the signal on complementary enable signal node ENABLEB is a logical high. The signals on enable signal node ENABLE and/or complementary enable signal node ENABLEB enable operation of the clock generator 600 in FIG. 6 and the generation of reference voltages by the reference voltage circuit 700 in FIGS. 7A and 7B.

The output terminal of the second comparator COMP2 790 is further electrically connected to data input terminal D and reset input terminal RN of a first D flip-flop 796 and to a reset input terminal RN of a second D flip-flop 798. An output terminal Q of the first D flip-flop 796 is electrically connected to a data input terminal D of the second D flip-flop 798. An output terminal Q of the second D flip-flop 798 is electrically connected to the reset node RESET. The output clock node CLKOUT is electrically connected to the clock input terminals C of the first D flip-flop 796 and second D flip-flop 798.

If the first reference voltage $V_{R1}$ on the first reference voltage node VREF1 becomes greater than the voltage on the non-inverting input terminal of the second comparator COMP2 790, such as during abnormal conditions, the signal on the output terminal of the second comparator COMP2 790 becomes a logical low. When the signal on the output terminal of the second comparator COMP2 790 becomes a logical low, the output terminals Q of the first D flip-flop 796 and second D flip-flop 798 are reset to a logical low according to the truth table of Table 4. After the voltage on the non-inverting input terminal of the second comparator COMP2 790 returns to be greater than the first reference voltage $V_{R1}$ on the first reference voltage node VREF1 such that the signal on the output terminal of the second comparator COMP2 790 becomes a logical high, and on the first rising edge of the clock signal on the output clock node CLKOUT, the logical low that was previously output on the output terminal Q of the first D flip-flop 796 is propagated to the output terminal Q of the second D flip-flop 798, and the logical high on the output terminal of the second comparator COMP2 790 is propagated to the output terminal Q of the first D flip-flop 796. Hence, after one rising edge of the clock signal, the signal on reset node RESET remains a logical low. On the second rising edge of the clock signal on the output clock node CLKOUT, the logical high on the output terminal Q of the first D flip-flop 796 is propagated to the output terminal Q of the second D flip-flop 798 causing the signal on the reset node RESET to become a logical high. This configuration can allow for a reset state to persist, e.g., by a logical low signal on reset node RESET, for two clock cycles after the abnormal conditions that cause the reset state to be initiated have cleared. This persistence can allow for analog portions of the photo sensor to settle before the photo sensor resumes normal operation.

Figure 8A:
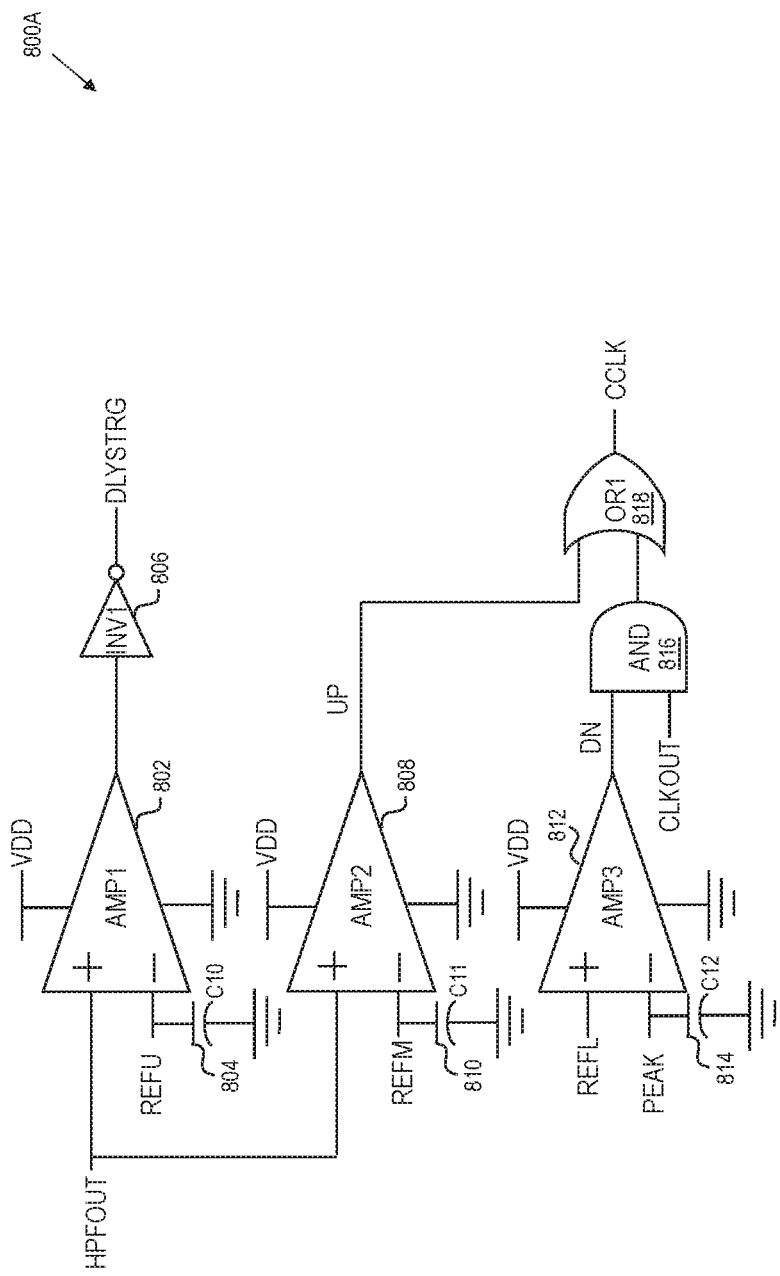
FIGS. 8A and 8B are an example automatic gain control circuit in accordance with some embodiments.
Figure 8B:
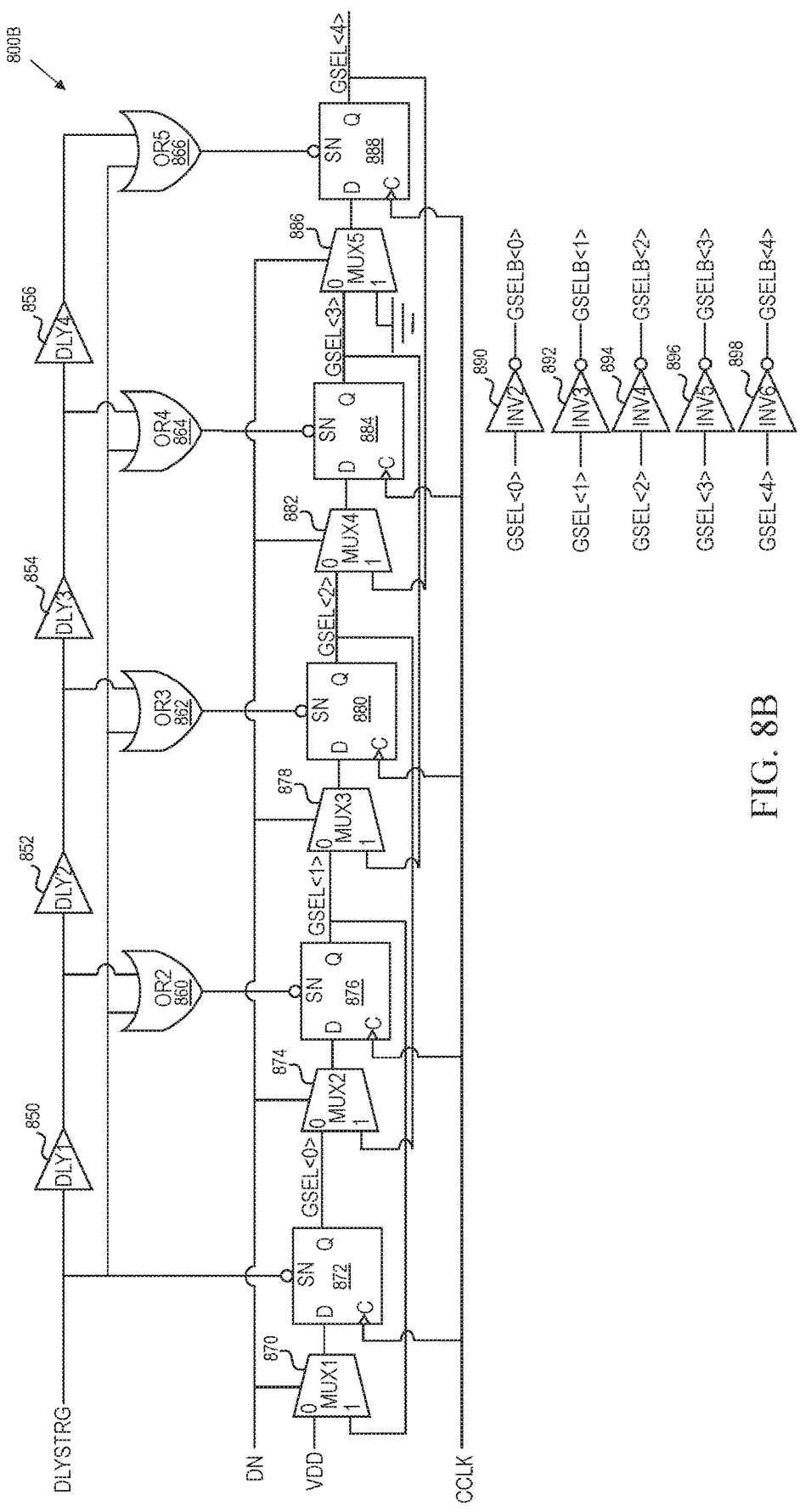

FIGS. 8A and 8B illustrate an example automatic gain control circuit 800A and 800B in accordance with some embodiments. Referring first to FIG. 8A, the high pass filter output node HPFOUT is electrically connected to non-inverting input terminals of a first operational amplifier AMP1 802 and a second operational amplifier AMP2 808. The upper voltage reference node REFU is electrically connected to an inverting input terminal of the first operational amplifier AMP1 802 and to a first terminal of a tenth capacitor C10 804. A second terminal of the tenth capacitor C10 804 is electrically connected to a ground node. An output terminal of the first operational amplifier AMP1 802 is electrically connected to an input terminal of a first inverter INV1 806, and an output terminal of the first inverter INV1 806 is electrically connected to a delay string input node DLYSTRG.

The middle voltage reference node REFM is electrically connected to an inverting input terminal of the second operational amplifier AMP2 808 and to a first terminal of an eleventh capacitor C11 810. A second terminal of the eleventh capacitor C11 810 is electrically connected to a ground node. An output terminal of the second operational amplifier AMP2 808 is electrically connected to an up signal indication node UP.

The lower voltage reference node REFL is electrically connected to a non-inverting input terminal of a third operational amplifier AMP3 812. The peak detect output node PEAK is electrically connected to an inverting input terminal of the third operational amplifier AMP3 812 and to a first terminal of a twelfth capacitor C12 814. A second terminal of the twelfth capacitor C12 814 is electrically connected to a ground node. An output terminal of the third operational amplifier AMP3 812 is electrically connected to a down signal indication node DN.

The down signal indication node DN is electrically connected to a first input terminal of an AND gate AND 816, and the output clock node CLKOUT is electrically connected to a second input terminal of the AND gate AND 816. An output terminal of the AND gate AND 816 is electrically connected to a first input terminal of a first OR gate OR1 818, and the up signal indication node UP is electrically connected to a second input terminal of the first OR gate OR1 818. An output terminal of the first OR gate OR1 818 is electrically connected to a control-clock node CCLK.

Referring now to FIG. 8B, the delay string input node DLYSTRG is electrically connected to an input terminal of a first delay element DLY1 850, and an output terminal of the first delay element DLY1 850 is electrically connected to a first input terminal of a second OR gate OR2 860 and an input terminal of a second delay element DLY2 852. An output terminal of the second delay element DLY2 852 is electrically connected to a first input terminal of a third OR gate OR3 862 and an input terminal of a third delay element DLY3 854. An output terminal of the third delay element DLY3 854 is electrically connected to a first input terminal of a fourth OR gate OR4 864 and an input terminal of a fourth delay element DLY4 856. An output terminal of the fourth delay element DLY4 856 is electrically connected to a first input terminal of a fifth OR gate OR5 866. The delay string input node DLYSTRG is further electrically connected to respective second input terminals of the second OR gate OR2 860, third OR gate OR3 862, fourth OR gate OR4 864, and fifth OR gate OR5 866.

The delay string input node DLYSTRG is further electrically connected to a set input terminal SN of a first D flip-flop 872. An output terminal of the second OR gate OR2 860 is electrically connected to a set input terminal SN of a second D flip-flop 876. An output terminal of the third OR gate OR3 862 is electrically connected to a set input terminal SN of a third D flip-flop 880. An output terminal of the fourth OR gate OR4 864 is electrically connected to a set input terminal SN of a fourth D flip-flop 884. An output terminal of the fifth OR gate OR5 866 is electrically connected to a set input terminal SN of a fifth D flip-flop 888.

The power supply node VDD is electrically connected to a select-low input terminal 0 of a first multiplexer MUX1 870, and a feedback gain select signal second bit node GSEL<1> is electrically connected to a select-high input terminal 1 of the first multiplexer MUX1 870. An output terminal of the first multiplexer MUX1 870 is electrically connected to a data input terminal D of the first D flip-flop 872. An output terminal Q of the first D flip-flop 872 is electrically connected to the gain select signal first bit node GSEL<0> and to a select-low input terminal 0 of a second multiplexer MUX2 874, and a feedback gain select signal third bit node GSEL<2> is electrically connected to a select-high input terminal 1 of the second multiplexer MUX2 874. An output terminal of the second multiplexer MUX2 874 is electrically connected to a data input terminal D of the second D flip-flop 876. An output terminal Q of the second D flip-flop 876 is electrically connected to the gain select signal second bit node GSEL<1> and to a select-low input terminal 0 of a third multiplexer MUX3 878, and a feedback gain select signal fourth bit node GSEL<3> is electrically connected to a select-high input terminal 1 of the third multiplexer MUX3 878. An output terminal of the third multiplexer MUX3 878 is electrically connected to a data input terminal D of the third D flip-flop 880. An output terminal Q of the third D flip-flop 880 is electrically connected to the gain select signal third bit node GSEL<2> and to a select-low input terminal 0 of a fourth multiplexer MUX4 882, and a feedback gain select signal fifth bit node GSEL<4> is electrically connected to a select-high input terminal 1 of the fourth multiplexer MUX4 882. An output terminal of the fourth multiplexer MUX4 882 is electrically connected to a data input terminal D of the fourth D flip-flop 884. An output terminal Q of the fourth D flip-flop 884 is electrically connected to the gain select signal fourth bit node GSEL<3> and to a select-low input terminal 0 of a fifth multiplexer MUX5 886, and a ground node is electrically connected to a select-high input terminal 1 of the fifth multiplexer MUX5 886. An output terminal of the fifth multiplexer MUX5 886 is electrically connected to a data input terminal D of the fifth D flip-flop 888. An output terminal Q of the fifth D flip-flop 888 is electrically connected to the gain select signal fifth bit node GSEL<4>.

The down signal indication node DN is electrically connected to respective select control input terminals of the first multiplexer MUX1 870, second multiplexer MUX2 874, third multiplexer MUX3 878, fourth multiplexer MUX4 882, and fifth multiplexer MUX5 886. The control-clock node CCLK is electrically connected to respective clock input terminals C of the first D flip-flop 872, second D flip-flop 876, third D flip-flop 880, fourth D flip-flop 884, and fifth D flip-flop 888.

The gain select signal first bit node GSEL<0> is electrically connected to an input terminal of a second inverter INV2 890, and an output terminal of the second inverter INV2 890 is electrically connected to a complementary gain select signal first bit node GSELB<0>. The gain select signal second bit node GSEL<1> is electrically connected to an input terminal of a third inverter INV3 892, and an output terminal of the third inverter INV3 892 is electrically connected to a complementary gain select signal second bit node GSELB<1>. The gain select signal third bit node GSEL<2> is electrically connected to an input terminal of a fourth inverter INV4 894, and an output terminal of the fourth inverter INV4 894 is electrically connected to a complementary gain select signal third bit node GSELB<2>. The gain select signal fourth bit node GSEL<3> is electrically connected to an input terminal of a fifth inverter INV5 896, and an output terminal of the fifth inverter INV5 896 is electrically connected to a complementary gain select signal fourth bit node GSELB<3>. The gain select signal fifth bit node GSEL<4> is electrically connected to an input terminal of a sixth inverter INV6 898, and an output terminal of the sixth inverter INV6 898 is electrically connected to a complementary gain select signal fifth bit node GSELB<4>.

For convenience, a truth table of the first, second, third, fourth, and fifth D flip-flops 872, 876, 880, 884, and 888 is shown in Table 8 below.

TABLE 8

| D | C | SN | Q |
|---|---|---|---|
| 0 | Rising Edge | 1 | 0 |
| 1 | Rising Edge | 1 | 1 |
| X | Asynchronous | 0 | 1 |

To illustrate the operation of the automatic gain control circuit 800A and 800B, assume that the photo sensor 100 is in a steady state (e.g., more than five clock cycles) where the photo sensor 100 is not receiving an optical signal or light. In this state, the voltage $V_{HOUT}$ on high pass filter output node HPFOUT is less than the upper reference voltage $V_{RU}$ on the upper voltage reference node REFU and the mid reference voltage $V_{RM}$ on the middle voltage reference node REFM, and the peak voltage $V_P$ is less than the lower reference voltage $V_{RL}$ on the lower voltage reference node REFL. When $V_{HOUT}<V_{RU}$, the signal on the delay string input node DLYSTRG is a logical high, which provides a logical high on the set input terminals SN of the first, second, third, fourth, and fifth D flip-flops 872, 876, 880, 884, and 888. At this steady state (e.g., more than five clock cycles), the signal on down signal indication node DN is a logical high (because $V_P<V_{RL}$), which initially causes a logical low to be provided first at the output terminal of the fifth multiplexer MUX5 886 and at the data input terminal D of the fifth D flip-flop 888, and subsequently, for each rising edge of a clock signal on control-clock node CCLK, at an output terminal of a preceding multiplexer and a data input terminal D of a preceding D flip-flop until the output terminals Q of the fifth D flip-flop 888, fourth D flip-flop 884, third D flip-flop 880, second D flip-flop 876, and first D flip-flop 872 have a logical low. During this steady state, since $V_P<V_{RL}$ and $V_{HOUT}<V_{RM}$, the signal on the control-clock node CCLK is the same logical signal that is on output clock node CLKOUT, which allows rising edges to be provided at the clock input terminals C of the first, second, third, fourth, and fifth D flip-flops 872, 876, 880, 884, and 888. With the output terminals Q of the first, second, third, fourth, and fifth D flip-flops 872, 876, 880, 884, and 888, and hence, the signals on the gain select signal first through fifth bit nodes GSEL<0:4>, respectively, set to a logical low, the gain of the low pass filter and high pass filter are set to a highest gain.

Next, assume that $V_{HOUT}$ begins to increase. At $V_{RU}>V_{HOUT}>V_{RM}$, the signal on control-clock node CCLK holds a logical high, and the clock input terminals C of the first, second, third, fourth, and fifth D flip-flops 872, 876, 880, 884, and 888 stop receiving a rising edge. In this state, as long as $V_{RU}>V_{HOUT}>V_{RM}$, the first, second, third, fourth, and fifth D flip-flops 872, 876, 880, 884, and 888 do not change states since the set input terminals SN remain at a logical high and the clock input terminals C do not receive a rising edge. Hence, the output terminals Q of the first, second, third, fourth, and fifth D flip-flops 872, 876, 880, 884, and 888, and hence, the signals on the gain select signal first through fifth bit nodes GSEL<0:4>, respectively, continue to be set to a logical low, and the gain of the low pass filter and high pass filter are set to a highest gain.

Then, assume at time T[0] that $V_{HOUT}>V_{RU}$. At this point, note that since the previous assumptions were that $V_{RU}>V_{HOUT}$ for times T[−5] to T[−1], the signals on the output terminals of the first delay element DLY1 850, second delay element DLY2 852, third delay element DLY3 854, and fourth delay element DLY4 856 are logical high. Since at time T[0] that $V_{HOUT}>V_{RU}$, the signal on the delay string input node DLYSTRG becomes a logical low, which sets the signal on the output terminal Q of the first D flip-flop 872 to a logical high. The second D flip-flop 876, third D flip-flop 880, fourth D flip-flop 884, and fifth D flip-flop 888 are not set because the outputs of the second OR gate OR2 860, third OR gate OR3 862, fourth OR gate OR4 864, and fifth OR gate OR5 866 remain a logical high because the signals on the output terminals of the first delay element DLY1 850, second delay element DLY2 852, third delay element DLY3 854, and fourth delay element DLY4 856 are logical high. As a result, gain select signal first bit node GSEL<0> is a logical high, while gain select signal second through fifth bit nodes GSEL<1:4> are logical low.

If switching the gain select signal first bit node GSEL<0> from a logical low to a logical high results in $V_{RU}>V_{HOUT}>V_{RM}$ at time T[1], the first D flip-flop 872, second D flip-flop 876, third D flip-flop 880, fourth D flip-flop 884, and fifth D flip-flop 888 do not change states as described previously. If switching the gain select signal first bit node GSEL<0> from a logical low to a logical high results in $V_{HOUT}>V_{RU}$ at time T[1], the signals on the delay string input node DLYSTRG and the output terminal of second OR gate OR2 860 are a logical low, which set the signals on the output terminals Q of the first D flip-flop 872 and second D flip-flop 876 to a logical high. As long as $V_{HOUT}>V_{RU}$ continuously, the next subsequent flip-flop will be set at the next subsequent time until time T[4] when, as a result of $V_{HOUT}>V_{RU}$ at times T[0] to T[4], the signals on the delay string input node DLYSTRG and the output terminals of the first delay element DLY1 850, second delay element DLY2 852, third delay element DLY3 854, and fourth delay element DLY4 856 are logical low, which causes the output terminals Q of the first D flip-flop 872, second D flip-flop 876, third D flip-flop 880, fourth D flip-flop 884, and fifth D flip-flop 888 to be set to a logical high. Hence, the output terminals Q of the first, second, third, fourth, and fifth D flip-flops 872, 876, 880, 884, and 888, and hence, the signals on the gain select signal first through fifth bit nodes GSEL<0:4>, respectively, are set to a logical high, and the gain of the low pass filter and high pass filter are set to a lowest gain.

If switching the gain select signal first bit node GSEL<0> from a logical low to a logical high results in $V_{RM}>V_{HOUT}$ at time T[1], the operation of the first, second, third, fourth, and fifth D flip-flops 872, 876, 880, 884, and 888 depends on whether $V_{RL}>V_P$. If $V_{RL}>V_P$, a clock signal is on the control-clock node CCLK and the control signal input on the select control input terminals of the first multiplexer MUX1 870, second multiplexer MUX2 874, third multiplexer MUX3 878, fourth multiplexer MUX4 882, and fifth multiplexer MUX5 886 is a logical high. This causes the signals on the gain select signal first through fifth bit nodes GSEL<0:4> to be shifted one bit from right to left each clock cycle until $V_P>V_{RL}$ or $V_{HOUT}>V_{RM}$. If, as the signals on gain select signal first through fifth bit nodes GSEL<0:4> are being shifted from right to left, $V_P$ becomes greater than $V_{RL}$ ($V_P>V_{RL}$) and $V_{RM}$ remains greater than $V_{HOUT}$ ($V_{RM}>V_{HOUT}$), the signal on the control-clock node CCLK becomes a logical low, and the first, second, third, fourth, and fifth D flip-flops 872, 876, 880, 884, and 888 do not receive a rising edge to trigger propagation of a signal on a data input terminal D such that the signals on gain select signal first through fifth bit nodes GSEL<0:4> remain in their respective states. If, subsequently, $V_{HOUT}$ becomes greater than $V_{RM}$ ($V_{HOUT}>V_{RM}$), the signal on the control-clock node CCLK transitions from a logical low to a logical high, which provides a rising edge on the clock input terminals C of the first, second, third, fourth, and fifth D flip-flops 872, 876, 880, 884, and 888. Since $V_P>V_{RL}$, the signal on the select control input terminals of the first multiplexer MUX1 870, second multiplexer MUX2 874, third multiplexer MUX3 878, fourth multiplexer MUX4 882, and fifth multiplexer MUX5 886 is a logical low, and the signals of gain select signal first through fourth bit nodes GSEL<0:3> are shifted one bit from left to right to the signals on gain select signal second through fifth bit nodes GSEL<1:4> while a logical high is propagated to the signal on gain select signal first bit node GSEL<0> upon the rising edge.

The functionality described with respect to the automatic gain control circuit 800A and 800B of FIGS. 8A and 8B may not be exhaustive of conditions that may occur in the photo sensor. A person having ordinary skill in the art will understand other functionality for other conditions that may occur in the photo sensor.

Some embodiments consistent with the above description of FIGS. 1 through 6, 7A, 7B, 8A, and 8B may include various aspects that may be advantageous; although, other embodiments may not include such aspects. For example, the photo diode may be on-die or on-chip; although in other instances, the photo diode may be off-chip. The output buffer can output up to 32 mA. The one or both of the low pass filter and the high pass filter (or other configuration of a filter circuit) can filter signals from 0 Hz (e.g., DC) to 150 Hz, for example. The photo sensor may be operable from 10 kHz to 128 kHz with an auto adjustable gain up to, for example, 35 dB. Further, the photo sensor may include ambient immunity due to the combination of low pass and high pass filters. The photo sensor may have a wide range power input, such as from 3 µW to 65 µW, without saturating signals in the photo sensor that might otherwise cause a faulty output signal. Further, the photo sensor may meet ANSIC12-18 optical port requirements.

Figure 9:
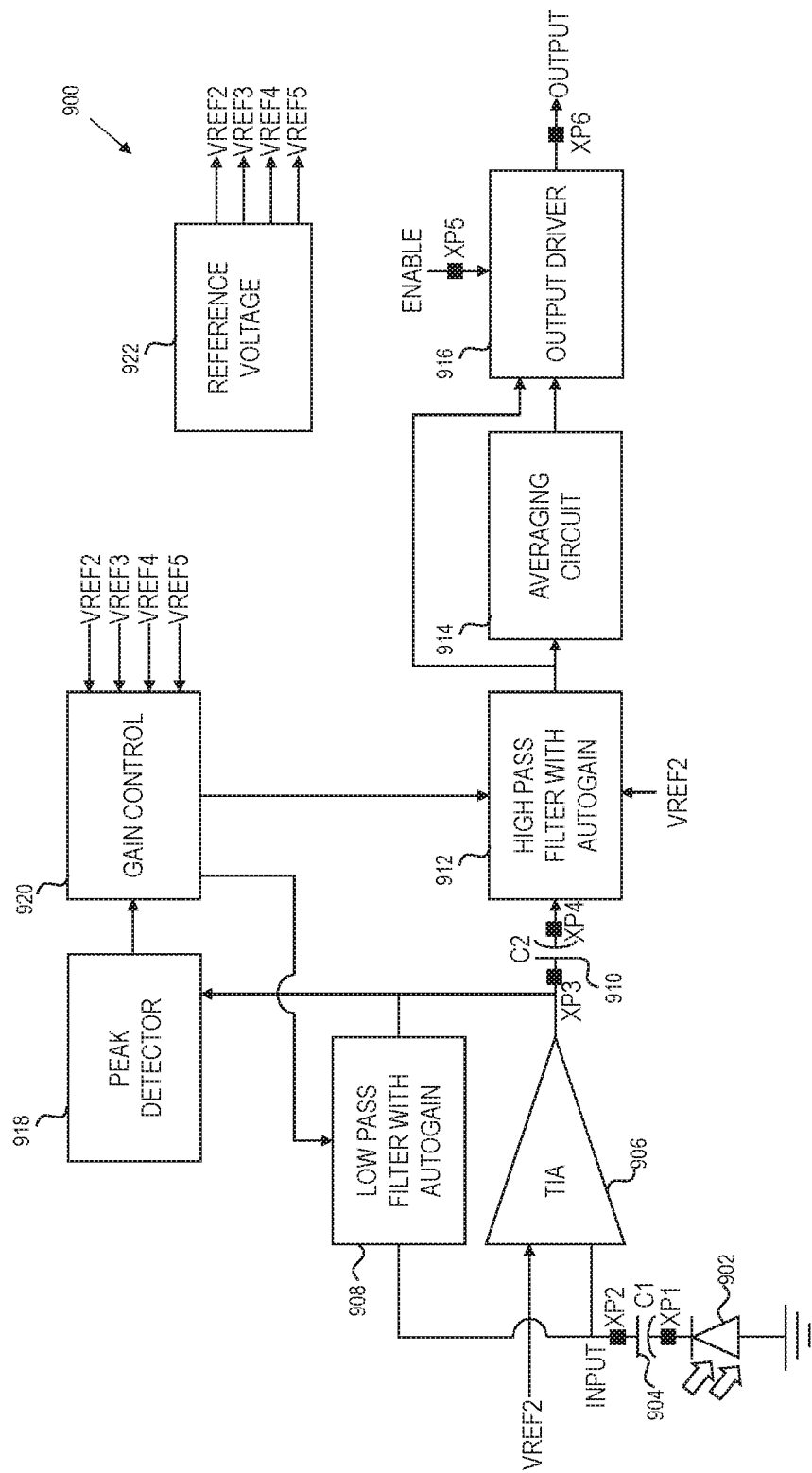
FIG. 9 is a simplified schematic of an example photo sensor in accordance with some embodiments.

FIG. 9 illustrates a simplified schematic of an example photo sensor 900 in accordance with some embodiments. Various portions of the photo sensor 900 are illustrated with more detail in FIGS. 10 through 14 below, in accordance with some embodiments. In some implementations, various components of the photo sensor 900 are on a single chip while other components are off-chip but electrically connected or coupled to the chip, such as illustrated in the figures and described herein. In other implementations, the photo sensor 900 may be an integrated solution formed on a single chip or semiconductor die. Further, the photo sensor 900 may be capable of detecting a wide range of optical power, such as from 25 µW to 65 µW; although other example photo sensors may be capable of detecting other ranges of optical power. Other example photo sensors may omit some components and/or may include additional components compared to the photo sensor 900 illustrated in FIG. 9.

The photo sensor 900 includes a photo diode 902. The photo diode 902 includes a p-n junction in a semiconductor substrate of the chip or die, which substrate may be a p-type substrate, for example. In some implementations, the photo diode 902 has an area upon which an optical signal or light may impinge of approximately 400 µm². In some implementations, the spectral sensitivity of the photo diode 902 for optical signals having wavelengths of 800 to 1,000 nm may be 0.3 A/W to 0.05 A/W, and the photo diode 902 may output approximately 1.25 µA at a lower bound for an optical signal having a power of 25 µW and approximately 19.5 µA at an upper bound for an optical signal having a power of 65 µW. The anode of the photo diode 902 is electrically connected to a ground node, while the cathode of the photo diode 902 is electrically connected to a first external pin XP1. The first external pin XP1 and other external pins described herein are each a pin on the chip that permits connections and/or couplings to the circuit on the chip with components off the chip.

A first terminal of a first capacitor C1 904 (e.g., a coupling capacitor) is electrically connected to the first external pin XP1, and a second terminal of the first capacitor C1 904 is electrically connected to a second external pin XP2, which is an input signal node INPUT. The input signal node INPUT is electrically connected to a first input terminal of a transimpedance amplifier (TIA) 906. A second reference voltage node VREF2 is electrically connected to a second input terminal of the TIA 906.

The photo sensor 900 includes a low pass filter 908 that includes automatic gain selection capability. The low pass filter 908 is electrically connected between the input signal node INPUT and an output terminal of the TIA 906, which is further electrically connected to a third external pin XP3. A first terminal of a second capacitor C2 910 (e.g., a coupling capacitor) is electrically connected to the third external pin XP3, and a second terminal of the second capacitor C2 910 is electrically connected to a fourth external pin XP4, which is electrically connected to an input node of a high pass filter 912 that includes automatic gain selection capability. The second reference voltage node VREF2 is electrically connected to an input node of the high pass filter 912.

An input node of the high pass filter 912 is electrically connected to an input node of an averaging circuit 914 and to an input node of an output driver 916. An output node of the averaging circuit 914 is electrically connected to an output node of the output driver 916. An enable signal node ENABLE is electrically connected to a fifth external pin XP5, which is further electrically connected to an input node of the output driver 916. An output node of the output driver 916 is electrically connected to a sixth external pin XP6 on which an output signal is provided.

An input node of a peak detector 918 is electrically connected to the output terminal of the TIA 906, and an output node of the peak detector 918 is electrically connected to a node of a gain control circuit 920. The gain control circuit 920 further has input nodes electrically connected to a second reference voltage node VREF2, a third reference voltage node VREF3, a fourth reference voltage node VREF4, and a fifth reference voltage node VREF5. Output nodes of the gain control circuit 920 are electrically connected to input nodes of the low pass filter 908 and high pass filter 912, through which control signals are transmitted to select gains in the low pass filter 908 and high pass filter 912. A reference voltage circuit 922 generates respective reference voltages on the second reference voltage node VREF2, third reference voltage node VREF3, fourth reference voltage node VREF4, and fifth reference voltage node VREF5.

A simplified, general description of the operation of the photo sensor 900 is now provided. An input signal from the photo diode 902, based on a received optical signal or light, is input to the TIA 906 and low pass filter 908, which has some selected low pass filter gain. Based on the input signal, a low pass filter output signal, with some gain relative to the input signal and based on the selected low pass filter gain, is output to the peak detector 918 and the high pass filter 912, which has some selected high pass filter gain. Based on the low pass filter output signal, a high pass filter output signal, with some gain relative to the low pass filter output signal and based on the selected high pass filter gain, is output to the averaging circuit 914 and the output driver 916. The averaging circuit 914 averages or integrates the high pass filter output signal to generate an average signal that is output to the output driver 916. The output driver 916 compares the high pass filter output signal to the average signal. If the high pass filter output signal is greater than the average signal and if the output driver 916 is enabled based on the input to the enable signal node ENABLE, the output driver 916 outputs a logical high signal on the output signal node OUTPUT. If the high pass filter output signal is less than the average signal and if the output driver 916 is enabled based on the input to the enable signal node ENABLE, or if the output driver 916 is not enabled based on the input to the enable signal node ENABLE, the output driver 916 outputs a logical low signal on the output signal node OUTPUT.

To control the gains in the low pass filter 908 and high pass filter 912, the low pass filter output signal is input to the peak detector 918, which generates a peak signal based on the low pass filter output signal. The peak signal is output from the peak detector 918 and input to the gain control circuit 920. The gain control circuit 920 compares the peak signal to reference voltages on the second reference voltage node VREF2, third reference voltage node VREF3, fourth reference voltage node VREF4, and fifth reference voltage node VREF5 to generate control signals that are input to the low pass filter 908 and high pass filter 912. The control signals are operable to open and close various switches in the low pass filter 908 and high pass filter 912 to adjust the gains of the low pass filter 908 and high pass filter 912.

Figure 10:
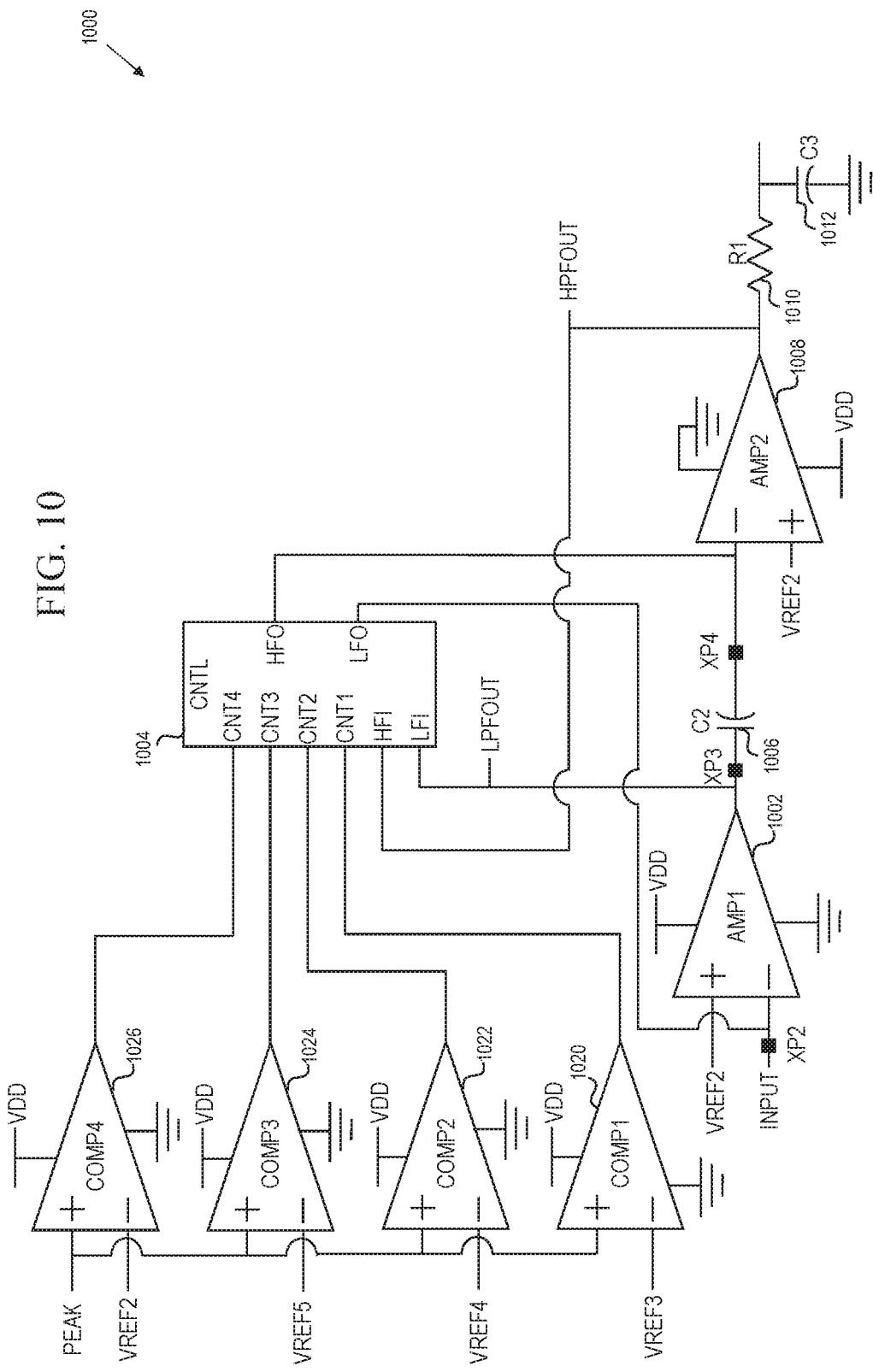
FIG. 10 is example TIA, low pass filter, high pass filter, and automatic gain control circuit in accordance with some embodiments.

FIG. 10 is an example TIA, low pass filter, high pass filter, and automatic gain control circuit 1000 in accordance with some embodiments. A second reference voltage node VREF2 is electrically connected to a non-inverting input terminal of a first operational amplifier AMP1 1002. An input signal node INPUT, e.g., via a second external pin XP2, is electrically connected to an inverting input terminal of the first operational amplifier AMP1 1002 and to a low pass filter feedback output node LFO of a control circuit CNTL 1004. An output terminal of the first operational amplifier AMP1 1002 is electrically connected to a low pass filter feedback input node LFI of the control circuit CNTL 1004, to a low pass filter output node LPFOUT, and to a third external pin XP3. The third external pin XP3 is electrically connected to a first terminal of a second capacitor C2 1006. A second terminal of the second capacitor C2 1006 is electrically connected to a fourth external pin XP4, and the fourth external pin XP4 is further electrically connected to a high pass filter feedback output node HFO of the control circuit CNTL 1004 and to an inverting input terminal of a second operational amplifier AMP2 1008. The second reference voltage node VREF2 is electrically connected to a non-inverting input terminal of the second operational amplifier AMP2 1008. An output terminal of the second operational amplifier AMP2 1008 is electrically connected to a high pass filter feedback input node HFI of the control circuit CNTL 1004, to a high pass filter output node HPFOUT, and to a first terminal of a first resistor R1 1010. A second terminal of the first resistor R1 1010 is electrically connected to a first terminal of a third capacitor C3 1012. A second terminal of the third capacitor C3 1012 is electrically connected to a ground node.

A peak detect output node PEAK is electrically connected to non-inverting input terminals of a first comparator COMP1 1020, a second comparator COMP2 1022, a third comparator COMP3 1024, and a fourth comparator COMP4 1026. A third reference voltage node VREF3 is electrically connected to an inverting input terminal of the first comparator COMP1 1020, and an output terminal of the first comparator COMP1 1020 is electrically connected to a first control input node CNT1. A fourth reference voltage node VREF4 is electrically connected to an inverting input terminal of the second comparator COMP2 1022, and an output terminal of the second comparator COMP2 1022 is electrically connected to a second control input node CNT2. A fifth reference voltage node VREF5 is electrically connected to an inverting input terminal of the third comparator COMP3 1024, and an output terminal of the third comparator COMP3 1024 is electrically connected to a third control input node CNT3. A second reference voltage node VREF2 is electrically connected to an inverting input terminal of the fourth comparator COMP4 1026, and an output terminal of the fourth comparator COMP4 1026 is electrically connected to a fourth control input node CNT4.

Figure 11:
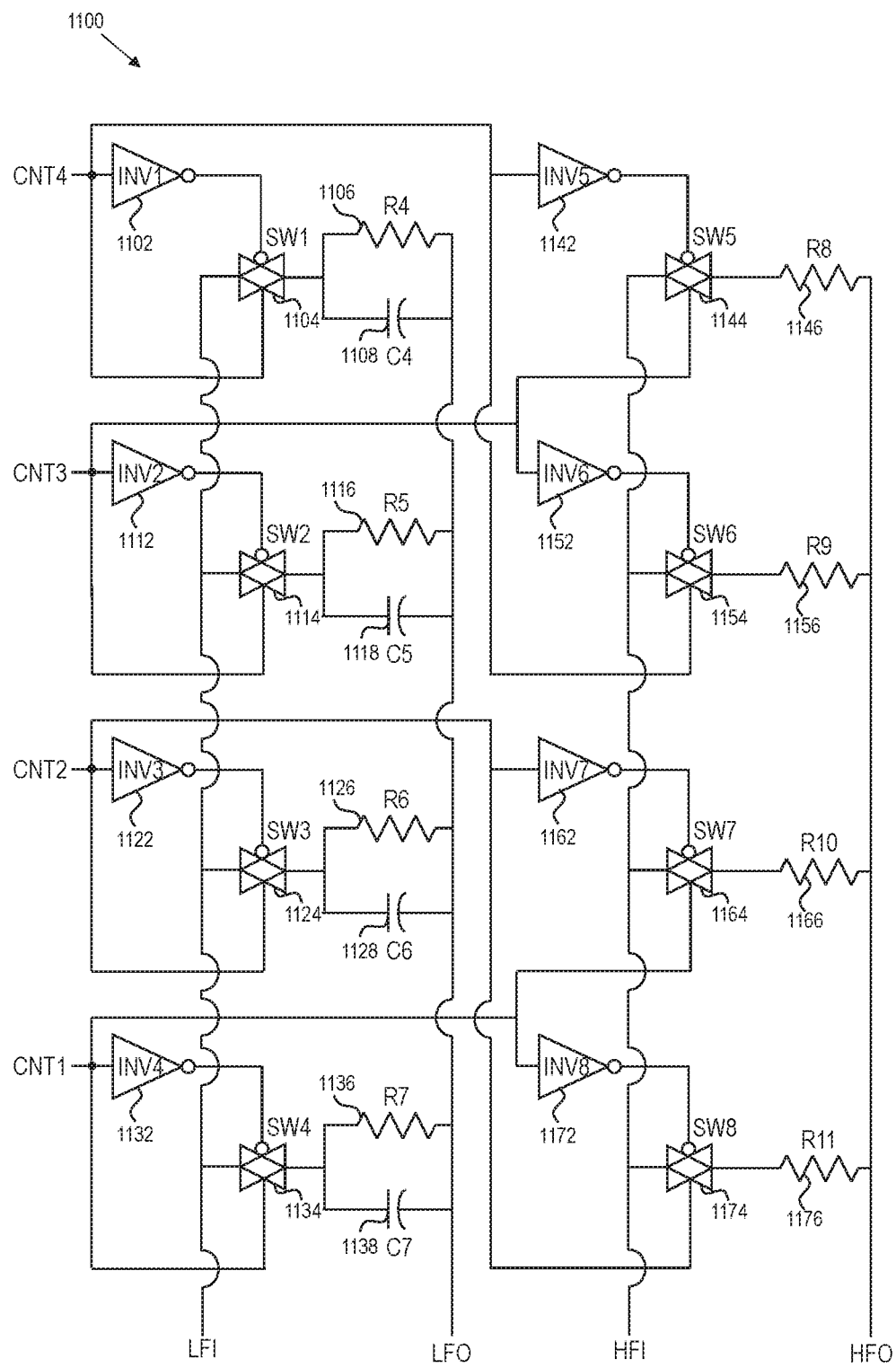
FIG. 11 is an example control circuit in accordance with some embodiments.

FIG. 11 illustrates an example control circuit CNTL 1100 in accordance with some embodiments. A circuit flowing from the low pass filter feedback input node LFI to the low pass filter feedback output node LFO, including inverters and switches controlling connections, is low pass filter gain selection circuitry. A circuit flowing from the high pass filter feedback input node HFI to the high pass filter feedback output node HFO, including inverters and switches controlling connections, is high pass filter gain selection circuitry.

The control circuit CNTL 1100 can be the control circuit CNTL 1004 of FIG. 10. The fourth control input node CNT4 is electrically connected to an input terminal of a first inverter INV1 1102 and to a high-enabled control input terminal of a first switch SW1 1104 (e.g., a transmission gate), and an output terminal of the first inverter INV1 1102 is electrically connected to a low-enabled control input terminal of the first switch SW1 1104. The low pass filter feedback input node LFI is electrically connected to a first pass-through terminal of the first switch SW1 1104, and a second pass-through terminal of the first switch SW1 1104 is electrically connected to respective first terminals of a fourth resistor R4 1106 and a fourth capacitor C4 1108. Respective second terminals of the fourth resistor R4 1106 and fourth capacitor C4 1108 are electrically connected together and to the low pass filter feedback output node LFO.

The third control input node CNT3 is electrically connected to an input terminal of a second inverter INV2 1112 and to a high-enabled control input terminal of a second switch SW2 1114 (e.g., a transmission gate), and an output terminal of the second inverter INV2 1112 is electrically connected to a low-enabled control input terminal of the second switch SW2 1114. The low pass filter feedback input node LFI is electrically connected to a first pass-through terminal of the second switch SW2 1114, and a second pass-through terminal of the second switch SW2 1114 is electrically connected to respective first terminals of a fifth resistor R5 1116 and a fifth capacitor C5 1118. Respective second terminals of the fifth resistor R5 1116 and fifth capacitor C5 1118 are electrically connected together and to the low pass filter feedback output node LFO.

The second control input node CNT2 is electrically connected to an input terminal of a third inverter INV3 1122 and to a high-enabled control input terminal of a third switch SW3 1124 (e.g., a transmission gate), and an output terminal of the third inverter INV3 1122 is electrically connected to a low-enabled control input terminal of the third switch SW3 1124. The low pass filter feedback input node LFI is electrically connected to a first pass-through terminal of the third switch SW3 1124, and a second pass-through terminal of the third switch SW3 1124 is electrically connected to respective first terminals of a sixth resistor R6 1126 and a sixth capacitor C6 1128. Respective second terminals of the sixth resistor R6 1126 and sixth capacitor C6 1128 are electrically connected together and to the low pass filter feedback output node LFO.

The first control input node CNT1 is electrically connected to an input terminal of a fourth inverter INV4 1132 and to a high-enabled control input terminal of a fourth switch SW4 1134 (e.g., a transmission gate), and an output terminal of the fourth inverter INV4 1132 is electrically connected to a low-enabled control input terminal of the fourth switch SW4 1134. The low pass filter feedback input node LFI is electrically connected to a first pass-through terminal of the fourth switch SW4 1134, and a second pass-through terminal of the fourth switch SW4 1134 is electrically connected to respective first terminals of a seventh resistor R7 1136 and a seventh capacitor C7 1138. Respective second terminals of the seventh resistor R7 1136 and seventh capacitor C7 1138 are electrically connected together and to the low pass filter feedback output node LFO.

The fourth control input node CNT4 is electrically connected to an input terminal of a fifth inverter INV5 1142, and an output terminal of the fifth inverter INV5 1142 is electrically connected to a low-enabled control input terminal of a fifth switch SW5 1144 (e.g., a transmission gate). The third control input node CNT3 is electrically connected to a high-enabled control input terminal of the fifth switch SW5 1144. The high pass filter feedback input node HFI is electrically connected to a first pass-through terminal of the fifth switch SW5 1144, and a second pass-through terminal of the fifth switch SW5 1144 is electrically connected to a first terminal of an eighth resistor R8 1146. A second terminal of the eighth resistor R8 1146 is electrically connected to the high pass filter feedback output node HFO.

The third control input node CNT3 is electrically connected to an input terminal of a sixth inverter INV6 1152, and an output terminal of the sixth inverter INV6 1152 is electrically connected to a low-enabled control input terminal of a sixth switch SW6 1154 (e.g., a transmission gate). The fourth control input node CNT4 is electrically connected to a high-enabled control input terminal of the sixth switch SW6 1154. The high pass filter feedback input node HFI is electrically connected to a first pass-through terminal of the sixth switch SW6 1154, and a second pass-through terminal of the sixth switch SW6 1154 is electrically connected to a first terminal of a ninth resistor R9 1156. A second terminal of the ninth resistor R9 1156 is electrically connected to the high pass filter feedback output node HFO.

The second control input node CNT2 is electrically connected to an input terminal of a seventh inverter INV7 1162, and an output terminal of the seventh inverter INV7 1162 is electrically connected to a low-enabled control input terminal of a seventh switch SW7 1164 (e.g., a transmission gate). The first control input node CNT1 is electrically connected to a high-enabled control input terminal of the seventh switch SW7 1164. The high pass filter feedback input node HFI is electrically connected to a first pass-through terminal of the seventh switch SW7 1164, and a second pass-through terminal of the seventh switch SW7 1164 is electrically connected to a first terminal of a tenth resistor R10 1166. A second terminal of the tenth resistor R10 1166 is electrically connected to the high pass filter feedback output node HFO.

The first control input node CNT1 is electrically connected to an input terminal of an eighth inverter INV8 1172, and an output terminal of the eighth inverter INV8 1172 is electrically connected to a low-enabled control input terminal of an eighth switch SW8 1174 (e.g., a transmission gate). The second control input node CNT2 is electrically connected to a high-enabled control input terminal of the eighth switch SW8 1174. The high pass filter feedback input node HFI is electrically connected to first pass-through terminal of the eighth switch SW8 1174, and a second pass-through terminal of the eighth switch SW8 1174 is electrically connected to a first terminal of an eleventh resistor R11 1176. A second terminal of the eleventh resistor R11 1176 is electrically connected to the high pass filter feedback output node HFO.

Figure 14:
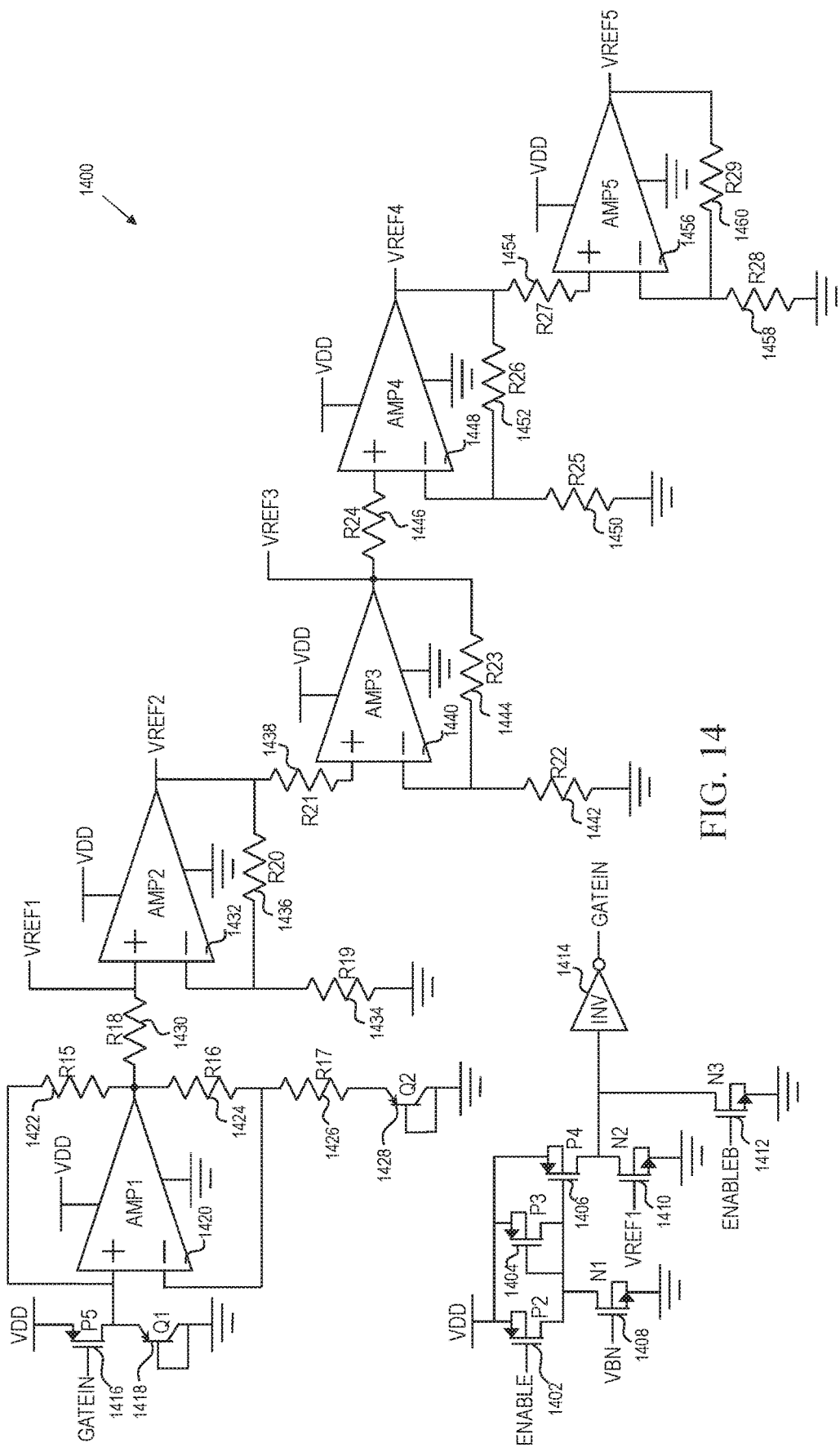
FIG. 14 is a reference voltage circuit in accordance with some embodiments.

As will become apparent from subsequent description in FIG. 14, the second reference voltage $V_{R2}$ on the second reference voltage node VREF2, the third reference voltage $V_{R3}$ on the third reference voltage node VREF3, the fourth reference voltage $V_{R4}$ on the fourth reference voltage node VREF4, and the fifth reference voltage $V_{R5}$ on the fifth reference voltage node VREF5 during normal operation generally follows $V_{R2}<V_{R3}<V_{R4}<V_{R5}$. Depending on the peak voltage $V_P$ on the peak detect output node PEAK that is input to the first comparator COMP1 1020, second comparator COMP2 1022, third comparator COMP3 1024, and fourth comparator COMP4 1026 and compared to respective reference voltages $V_{R3}$, $V_{R4}$, $V_{R5}$, and $V_{R2}$, the logical control signals on first control input node CNT1, second control input node CNT2, third control input node CNT3, and fourth control input node CNT4 cause the impedances of the feedback loops of the low pass filter and the high pass filter to be selected to adjust the gain of those filters. Table 9 below summarizes various states and impedances corresponding to those states under normal operating conditions where $V_{R2}<V_{R3}<V_{R4}<V_{R5}$. The listed impedances are for the low pass filter feedback $Z_{LPFFB}$ (e.g., the impedance between the output terminal and inverting input terminal of the first operational amplifier AMP1 1002) and the high pass filter feedback $Z_{HPFFB}$ (e.g., the impedance between the output terminal and inverting input terminal of the second operational amplifier AMP2 1008). A person having ordinary skill in the art will understand that impedances from the first, second, third, fourth, fifth, sixth, seventh, and eighth switches SW1 1104, SW2 1114, SW3 1124, SW4 1134, SW5 1144, SW6 1154, SW7 1164, and SW8 1174 can affect respective impedances of the filters. However, for ease of discussion herein, the impedances of the switches are assumed to be negligible.

TABLE 9

| State | CNT1 | CNT2 | CNT3 | CNT4 | $Z_{LPFFB}$ | $Z_{HPFFB}$ |
|---|---|---|---|---|---|---|
| $V_P < V_{R2}$ | 0 | 0 | 0 | 0 | Open | Open |
| $V_{R2} < V_P < V_{R3}$ | 0 | 0 | 0 | 1 | R4∥C4 | R8∥R9 |
| $V_{R3} < V_P < V_{R4}$ | 1 | 0 | 0 | 1 | R4∥C4∥R7∥C7 | R8∥R9∥R10∥R11 |
| $V_{R4} < V_P < V_{R5}$ | 1 | 1 | 0 | 1 | R4∥C4∥R7∥C7∥R6∥C6 | R8∥R9∥R10∥R11 |
| $V_{R5} < V_P$ | 1 | 1 | 1 | 1 | R4∥C4∥R7∥C7∥R6∥C6∥R5∥C5 | R8∥R9∥R10∥R11 |

For clarity, in some states as illustrated for the high pass filter feedback loop, control signals received at the control inputs of the respective fifth switch SW5 1144, sixth switch SW6 1154, seventh switch SW7 1164, and eighth switch SW8 1174 may not be complementary of each other. For example, in the state $V_{R2}<V_P<V_{R3}$, the control signal received at the low-enabled control input terminal of the fifth switch SW5 1144 is a logical low after the control signal on fourth control input node CNT4 is inverted by the fifth inverter INV5 1142, and the control signal received at the high-enabled control input terminal of the fifth switch SW5 1144 is a logical low from the control signal on the third control input node CNT3. In such states, impedance from the respective switch may be higher than if the control signals received at the control inputs of the switch are complementary of each other. This can occur, for example, because one device, such as a pFET of a transmission gate, can be in a closed state while another device, such as an nFET of the transmission gate, can be in an open state.

As seen from above, the low pass filter described herein can have four steps to accommodate a wide range of an input signal, e.g., resulting from an optical signal or light, such as from 25 µW to 65 µW. Other implementations can have different configurations and different steps of gain and/or with different gains. In some implementations, the total gain of the low pass filter can be 14 dB. Further, when the gain is adjusted in the low pass filter, the cutoff frequency of the frequency response of the low pass filter can vary. For example, in some implementations, the cutoff frequency can be varied from 1.8 MHz to 8 MHz when stepping through the different gains in the low pass filter. Also, the high pass filter described herein can have two steps, and in some implementations, the total gain of the high pass filter can be 14 dB. Other implementations can have different configurations and different steps of gain and/or with different total gain. In some implementations, the lower and upper cutoff frequencies of the high pass filter can be 150 Hz and 1.4 MHz, respectively.

As the peak voltage $V_P$ on the peak detect output node PEAK varies, e.g., based on the optical signal or light level, the first, second, third, and fourth comparators COMP1 1020, COMP2 1022, COMP3 1024, and COMP4 1026 compare the peak voltage $V_P$ to a corresponding reference voltage $V_{R2}$, $V_{R3}$, $V_{R4}$, and $V_{R5}$. As the peak voltage $V_P$ crosses a reference voltage, the output of the respective comparator changes states selecting the appropriate gain combination in feedback of the low pass filter and high pass filter. Each comparator output is connected to the feedback gain circuit. The gain stages can be designed such that as the peak voltage $V_P$ rises above each reference voltage, the next comparator is triggered high which turns on the next gain stage effectively reducing the total gain set by the feedback circuit. This design scheme can prevent the photo sensor from saturating at very high light levels.

Figure 12:
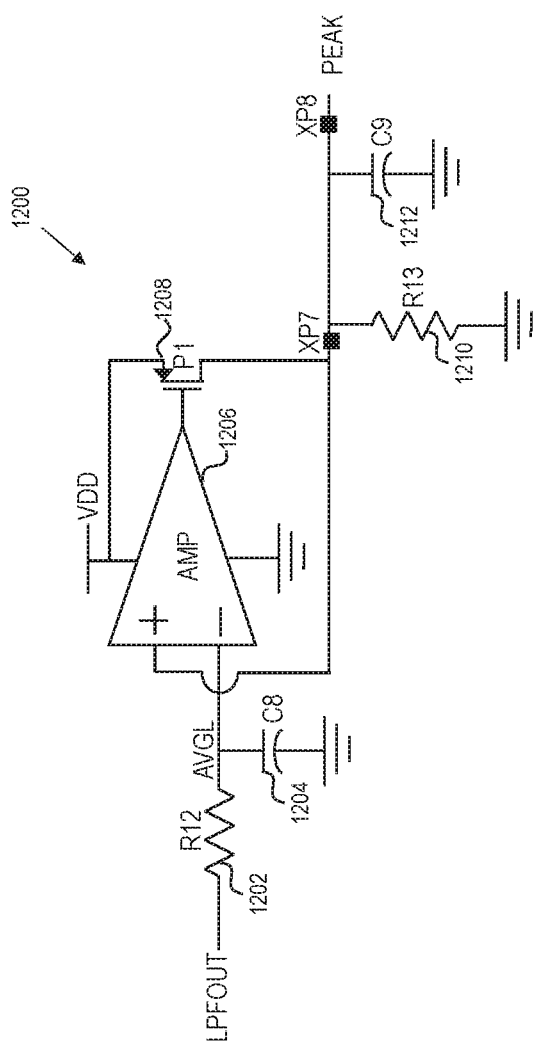
FIG. 12 is an example peak detector in accordance with some embodiments.

FIG. 12 is an example peak detector 1200 in accordance with some embodiments. The low pass filter output node LPFOUT is electrically connected to a first terminal of a twelfth resistor R12 1202. A second terminal of the twelfth resistor R12 1202 is electrically connected to a low pass filter output average node AVGL, to a first terminal of an eighth capacitor C8 1204, and to an inverting input terminal of an operational amplifier AMP 1206. A second terminal of the eighth capacitor C8 1204 is electrically connected to a ground node.

A source terminal of a first pFET P1 1208 is electrically connected to the power supply node VDD, and a gate terminal of the first pFET P1 1208 is electrically connected to an output terminal of the operational amplifier AMP 1206. A drain terminal of the first pFET P1 1208 is electrically connected to a seventh external pin XP7 and to a non-inverting input terminal of the operational amplifier AMP 1206. Respective first terminals of a thirteenth resistor R13 1210 and ninth capacitor C9 1212 are electrically connected to the seventh external pin XP7 and to an eighth external pin XP8, which is a peak detect output node PEAK, and respective second terminals of a thirteenth resistor R13 1210 and ninth capacitor C9 1212 are electrically connected to a ground node.

The peak detector 1200 receives the low pass filter output signal via the low pass filter output node LPFOUT, and integrates or averages the low pass filter to obtain an average low pass filter signal on the low pass filter output average node AVGL at the inverting input terminal of the operational amplifier AMP 1206. When the voltage on the low pass filter output average node AVGL is greater than the peak voltage $V_P$ on the peak detect output node PEAK, the output at the output terminal of the operational amplifier AMP 1206 is low, which turns on the first pFET P1 1208 to charge the ninth capacitor C9 1212 to obtain the peak voltage $V_P$ on the peak detect output node PEAK. When the voltage on the low pass filter output average node AVGL is less than the peak voltage $V_P$ on the peak detect output node PEAK, the output at the output terminal of the operational amplifier AMP 1206 is high, which turns off the first pFET P1 1208, and charge on the ninth capacitor C9 1212 is dissipated through the thirteenth resistor R13 1210 to obtain the peak voltage $V_P$ on the peak detect output node PEAK. Hence, the peak voltage $V_P$ on the peak detect output node PEAK can correspond to the low pass filter output signal via the low pass filter output node LPFOUT. For example, the peak voltage $V_P$ on the peak detect output node PEAK can be proportional to the low pass filter output signal.

Figure 13:
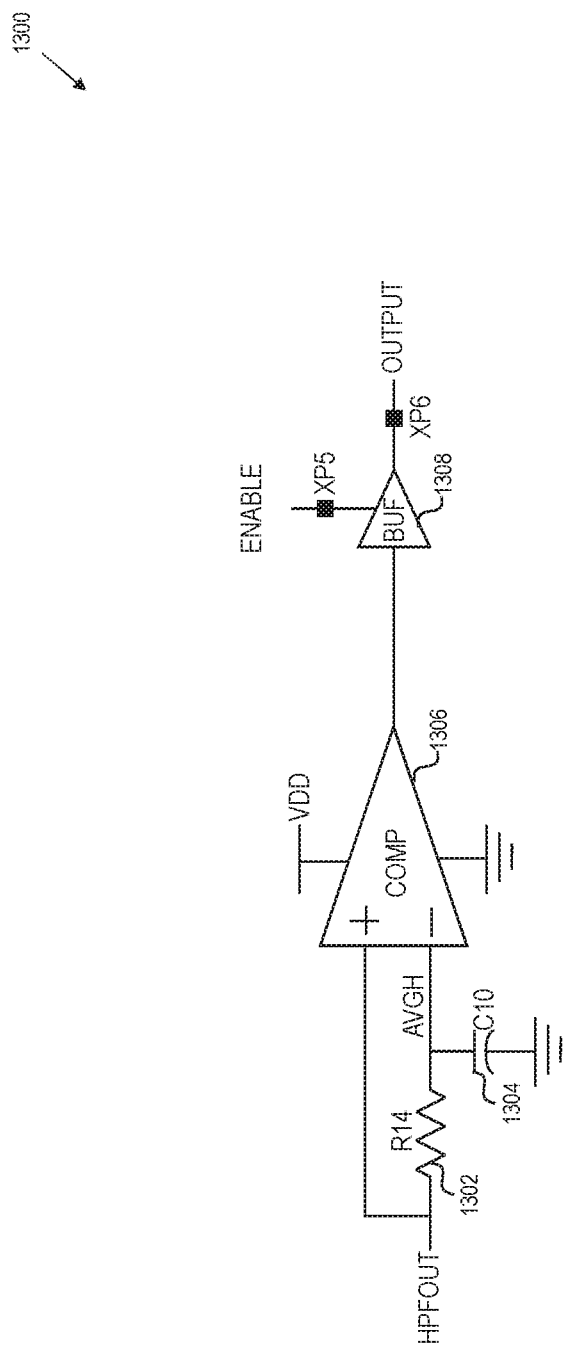
FIG. 13 is an example averaging circuit and output driver in accordance with some embodiments.

FIG. 13 is an example averaging circuit and output driver 1300 in accordance with some embodiments. The high pass filter output node HPFOUT is electrically connected to a first terminal of a fourteenth resistor R14 1302 and to a non-inverting input terminal of a comparator COMP 1306. A second terminal of the fourteenth resistor R14 1302 is electrically connected, to a high pass filter output average node AVGH, to a first terminal of a tenth capacitor C10 1304, and to an inverting input terminal of the comparator COMP 1306. A second terminal of the tenth capacitor C10 1304 is electrically connected to a ground node. An output terminal of the comparator COMP 1306 is electrically connected to an input terminal of a tri-state buffer BUF 1308. The enable signal node ENABLE, via a fifth external pin XP5, is electrically connected to a control input terminal of the tri-state buffer BUF 1308. An output terminal of the tri-state buffer BUF 1308 is electrically connected to a sixth external pin XP6, which is an output signal node OUTPUT.

The averaging circuit and output driver 1300 receives the high pass filter output signal via the high pass filter output node HPFOUT, and integrates or averages the high pass filter to obtain an average high pass filter signal on the high pass filter output average node AVGH at the inverting input terminal of the comparator COMP 1306. The averaging circuit can therefore track the high pass filter output signal to generate the average high pass filter signal that is proportional to the high pass filter output signal as the gain is varied. When the voltage on the high pass filter output average node AVGH is greater than the voltage on the high pass filter output node HPFOUT, the output at the output terminal of the comparator COMP 1306 is low, and if the tri-state buffer BUF 1308 is enabled (e.g., by a logical low on the enable signal node ENABLE), the tri-state buffer BUF 1308 drives the output signal on the output signal node OUTPUT low. When the voltage on the high pass filter output average node AVGH is less than the voltage on the high pass filter output node HPFOUT, the output at the output terminal of the comparator COMP 1306 is high, and if the tri-state buffer BUF 1308 is enabled, the tri-state buffer BUF 1308 drives the output signal on the output signal node OUTPUT high. If the tri-state buffer BUF 1308 is not enabled (e.g., by a logical high on the enable signal node ENABLE), the tri-state buffer BUF 1308 drives the output signal on the output signal node OUTPUT low.

FIG. 14 illustrates a reference voltage circuit 1400 in accordance with some embodiments. Respective source terminals and body terminals of a second pFET P2 1402, third pFET P3 1404, and fourth pFET P4 1406 are electrically connected to the power supply node VDD. A gate terminal of the second pFET P2 1402 is electrically connected to the enable signal node ENABLE. A drain terminal of the second pFET P2 1402 is electrically connected to a drain terminal of a first nFET N1 1408, to gate and drain terminals of the third pFET P3 1404, and to a gate terminal of the fourth pFET P4 1406. A gate terminal of the first nFET N1 1408 is electrically connected to a bias voltage node VBN, on which an appropriate bias voltage may be provided by any appropriate voltage bias generating circuit, and source and body terminals of the first nFET N1 1408 are electrically connected to a ground node. A drain terminal of the fourth pFET P4 1406 is electrically connected to respective drain terminals of a second nFET N2 1410 and a third nFET N3 1412 and to an input terminal of an inverter INV 1414. Respective source and body terminals of the second nFET N2 1410 and third nFET N3 1412 are electrically connected to a ground node. A gate terminal of the second nFET N2 1410 is electrically connected to a first reference voltage node VREF1, and a gate terminal of the third nFET N3 1412 is electrically connected to the complementary enable signal node ENABLEB.

An output terminal of the inverter INV 1414 is electrically connected to a gate terminal of a fifth pFET P5 1416 (via gate in node GATEIN). A source terminal of a fifth pFET P5 1416 is electrically connected to the power supply node VDD, and a drain terminal of the fifth pFET P5 1416 is electrically connected to an emitter terminal of a first PNP BJT Q1 1418, to a non-inverting input terminal of a first operational amplifier AMP1 1420, and to a first terminal of a fifteenth resistor R15 1422. Base and collector terminals of the first PNP BJT Q1 1418 are electrically connected to a ground node (e.g., connected as a diode).

A second terminal of the fifteenth resistor R15 1422 is electrically connected to an output terminal of the first operational amplifier AMP1 1420 and to respective first terminals of a sixteenth resistor R16 1424 and an eighteenth resistor R18 1430. A second terminal of the sixteenth resistor R16 1424 is electrically connected to an inverting input terminal of the first operational amplifier AMP1 1420 and to a first terminal of a seventeenth resistor R17 1426. A second terminal of the seventeenth resistor R17 1426 is electrically connected to an emitter terminal of a second PNP BJT Q2 1428, and base and collector terminals of the second PNP BJT Q2 1428 are electrically connected to a ground node (e.g., connected as a diode).

A second terminal of the eighteenth resistor R18 1430 is electrically connected to the first reference voltage node VREF1 and to a non-inverting input terminal of a second operational amplifier AMP2 1432. An inverting input terminal of the second operational amplifier AMP2 1432 is electrically connected to respective first terminals of a nineteenth resistor R19 1434 and a twentieth resistor R20 1436. A second terminal of the nineteenth resistor R19 1434 is electrically connected to a ground node, and a second terminal of the twentieth resistor R20 1436 is electrically connected to an output terminal of the second operational amplifier AMP2 1432, to the second reference voltage node VREF2, and to a first terminal of a twenty-first resistor R21 1438.

A second terminal of the twenty-first resistor R21 1438 is electrically connected to a non-inverting input terminal of a third operational amplifier AMP3 1440. An inverting input terminal of the third operational amplifier AMP3 1440 is electrically connected to respective first terminals of a twenty-second resistor R22 1442 and a twenty-third resistor R23 1444. A second terminal of the twenty-second resistor R22 1442 is electrically connected to a ground node, and a second terminal of the twenty-third resistor R23 1444 is electrically connected to an output terminal of the third operational amplifier AMP3 1440, to the third reference voltage node VREF3, and to a first terminal of a twenty-fourth resistor R24 1446.

A second terminal of the twenty-fourth resistor R24 1446 is electrically connected to a non-inverting input terminal of a fourth operational amplifier AMP4 1448. An inverting input terminal of the fourth operational amplifier AMP4 1448 is electrically connected to respective first terminals of a twenty-fifth resistor R25 1450 and a twenty-sixth resistor R26 1452. A second terminal of the twenty-fifth resistor R25 1450 is electrically connected to a ground node, and a second terminal of the twenty-sixth resistor R26 1452 is electrically connected to an output terminal of the fourth operational amplifier AMP4 1448, to the fourth reference voltage node VREF4, and to a first terminal of a twenty-seventh resistor R27 1454.

A second terminal of the twenty-seventh resistor R27 1454 is electrically connected to a non-inverting input terminal of a fifth operational amplifier AMP5 1456. An inverting input terminal of the fifth operational amplifier AMP5 1456 is electrically connected to respective first terminals of a twenty-eighth resistor R28 1458 and a twenty-ninth resistor R29 1460. A second terminal of the twenty-eighth resistor R28 1458 is electrically connected to a ground node, and a second terminal of the twenty-ninth resistor R29 1460 is electrically connected to an output terminal of the fifth operational amplifier AMP5 1456 and to the fifth reference voltage node VREF5.

A person having ordinary skill in the art will understand that with appropriate design consideration of the resistance values of various resistors, in normal operation, the first reference voltage $V_{R1}$ on the first reference voltage node VREF1, the second reference voltage $V_{R2}$ on the second reference voltage node VREF2, the third reference voltage $V_{R3}$ on the third reference voltage node VREF3, the fourth reference voltage $V_{R4}$ on the fourth reference voltage node VREF4, and the fifth reference voltage $V_{R5}$ on the fifth reference voltage node VREF5 are generally $V_{R1} < V_{R2} < V_{R3} < V_{R4} < V_{R5}$ (e.g., 1.22 V, 1.50 V, 1.65 V, 1.75 V, and 1.85 V, respectively). Further, a person having ordinary skill in the art will understand that an enable signal on enable signal node ENABLE and a complementary enable signal on complementary enable signal node ENABLEB enable the functionality of the reference voltage circuit 1400 by having the enable and complementary enable signals input to gate terminals of the second pFET P2 1402 and third nFET N3 1412, respectively.

Some embodiments consistent with the above description of FIGS. 9 through 14 may include various aspects that may be advantageous; although, other embodiments may not include such aspects. For example, the photo diode may be on-die or on-chip. The output buffer can output up to 2 mA. The photo sensor may be operable from 10 kHz to 128 kHz with an auto adjustable gain up to, for example, 28 dB.

Further, the photo sensor may include ambient immunity due to the combination of low pass and high pass filters. The photo sensor may have a wide range power input, such as from 25 µW to 65 µW, without saturating signals in the photo sensor that might otherwise cause a faulty output signal. Further, the photo sensor may meet ANSIC12-18 optical port requirements.

In view of the foregoing description, an embodiment is a photo sensor. The photo sensor comprises a photo diode, a filter circuit, and an output circuit. The filter circuit has an input node configured to be electrically coupled to an output node of the photo diode, and has an output node. The filter circuit has an adjustable gain, and the adjustable gain is adjustable based on a signal output from the filter circuit. The output circuit has an input node configured to be electrically coupled to the output node of the filter circuit.

In the photo sensor, the filter circuit can comprise a low pass filter and a high pass filter. The low pass filter can have an input node that is the input node of the filter circuit, and can have an output node. The high pass filter can have an input node configured to be electrically coupled to the output node of the low pass filter, and can have an output node that is the output node of the filter circuit. The photo sensor can further comprise a coupling capacitor electrically connected between the output node of the low pass filter and the input node of the high pass filter. In the photo sensor, the low pass filter can have a first adjustable gain configured to be adjustable based on the signal output from the filter circuit on the output node of the high pass filter, and the high pass filter can have a second adjustable gain configured to be adjustable based on the signal output from the filter circuit on the output node of the high pass filter. In the photo sensor, the low pass filter can have a first adjustable gain configured to be adjustable based on an intermediate signal on the output node of the low pass filter, and the high pass filter can have a second adjustable gain configured to be adjustable based on the intermediate signal on the output node of the low pass filter.

The photo sensor may further comprise control circuitry configured to output one or more control signals operable to control the adjustable gain based on the signal output from the filter circuit. The photo sensor may further comprise peak detector circuitry configured to output a peak signal based on the signal output from the filter circuit, and the control circuitry may be further configured to output the one or more control signals based on the peak signal. The photo sensor may further comprise reference voltage circuitry configured to output a plurality of reference voltages, and the control circuitry may be further configured to output the one or more control signals based on a comparison between the signal output from the filter circuit and one or more of the plurality of reference voltages.

The photo sensor may further comprise reference voltage circuitry, peak detector circuitry, and control circuitry. The reference voltage circuitry may be configured to output a first reference voltage, a second reference voltage, and a third reference voltage. The first reference voltage may be greater than the second reference voltage, and the second reference voltage may be greater than the third reference voltage. The peak detector circuitry may be configured to output a peak signal based on the signal output from the filter circuit. The control circuitry may comprise a first multiplexer-flip-flop pair and a second multiplexer-flip-flop pair. The first multiplexer-flip-flop pair can comprise a first multiplexer and a first flip-flop, and the second multiplexer-flip-flop pair can comprise a second multiplexer and a second flip-flop. An output terminal of the first multiplexer can be electrically connected to a data input terminal of the first flip-flop, and an output terminal of the second multiplexer can be electrically connected to a data input terminal of the second flip-flop. An output terminal of the first flip-flop may be configured to output at least a first control signal, and an output terminal of the second flip-flop may be configured to output a second control signal. The first control signal and the second control signal may be operable to control the adjustable gain. The output terminal of the first flip-flop may be electrically connected to an input terminal of the second multiplexer, and the output terminal of the second flip-flop may be electrically connected to an input terminal of the first multiplexer. A set input terminal of the first flip-flop may be configured to receive a first set signal based on a first comparison of the signal output from the filter circuit to the first reference voltage, and a set input terminal of the second flip-flop may be configured to receive a second set signal based on the first comparison or a time-delayed second comparison of the signal output from the filter circuit to the first reference voltage. A clock input terminal of the first flip-flop and a clock input terminal of the second flip-flop may be configured to receive a control signal based on a clock signal, a third comparison of the peak signal to the third reference voltage, and a fourth comparison of the signal output from the filter circuit and the second reference voltage. A select control input terminal of the first multiplexer and a select control input terminal of the second multiplexer may be configured to receive a signal based on the fourth comparison of the signal output from the filter circuit and the second reference voltage.

The photo sensor may further comprise reference voltage circuitry, peak detector circuitry, and control circuitry. The reference voltage circuitry may be configured to output a first reference voltage and a second reference voltage, and the first reference voltage may be greater than the second reference voltage. The peak detector circuitry may be configured to output a peak signal based on the signal output from the filter circuit. The control circuitry may comprise a first comparator and a second comparator. The first comparator may be configured to compare the peak signal to the first reference voltage and output a first control signal. The second comparator may be configured to compare the peak signal to the second reference voltage and output a second control signal. The first control signal and the second control signal may be operable to control the adjustable gain.

The photo sensor may further comprise peak detector circuitry configured to output an upper threshold signal and a lower threshold signal. The upper threshold signal and the lower threshold signal may be based on a peak signal based on the signal output from the filter circuit. The output circuit may comprise a first comparator, a second comparator, and a latch. The first comparator may be configured to compare the signal output from the filter circuit to the upper threshold signal and to output a first channel signal. The second comparator may be configured to compare the signal output from the filter circuit to the lower threshold signal and to output a second channel signal. The latch may be configured to receive the first channel signal and the second channel signal.

In the photo sensor, the output circuit can comprise a comparator and a buffer. The comparator can be configured to compare an additional signal output from the filter circuit to an integrated signal of the additional signal output from the filter circuit. The buffer can be configured to receive an output signal from the comparator and to output the output signal.

In accordance with another embodiment, a photo sensor comprises a photo diode, a filter circuit, a peak detector circuit, a gain control circuit, and an output circuit. The filter circuit has an input node electrically coupled to the photo diode and has a first output node. The filter circuit has an adjustable gain based on one or more control signals received on one or more input control nodes. The peak detector circuit has a first input node electrically coupled to the first output node of the filter circuit and has a first output node. The peak detector circuit is configured to provide a peak signal on the first output node of the peak detector circuit, and the peak signal is based on a filter signal on the first output node of the filter circuit. The gain control circuit has a first input node electrically coupled to the first output node of the peak detector circuit, a second input node electrically coupled to the first output node of the filter circuit, and one or more output nodes respectively electrically coupled to the one or more input control nodes of the filter circuit. The gain control circuit is configured to output the one or more control signals based on the peak signal, the filter signal, and a control-clock signal. The output circuit has a first input node electrically coupled to the first output node of the filter circuit and has an output node.

In the photo sensor, the photo diode, the filter circuit, the peak detector circuit, the gain control circuit, and the output circuit may be on a same single chip.

In the photo sensor, the gain control circuit may comprise a first comparator, a second comparator, a third comparator, a delay element, a logic gate, a logic circuit, and a cascaded flip-flop chain. The first comparator, second comparator, and third comparator each can have a first input terminal, a second input terminal, and an output terminal. The first input terminal of the first comparator and the first input terminal of the second comparator can be electrically coupled to the second input node of the gain control circuit. The second input terminal of the first comparator may be electrically coupled to an upper reference voltage node. The second input terminal of the second comparator may be electrically coupled to a mid reference voltage node. The first input terminal of the third comparator may be electrically coupled to a lower reference voltage node. The second input terminal of the third comparator may be electrically coupled to the first input node of the gain control circuit. The delay element may have an input terminal electrically coupled to the output terminal of the first comparator, and may have an output terminal. The logic gate may have a first input terminal electrically coupled to the output terminal of the first comparator, a second input terminal electrically coupled to the output terminal of the delay element, and an output terminal. The logic circuit may have a first input node electrically coupled to the output terminal of the second comparator, a second input node electrically coupled to the output terminal of the third comparator, a third input node electrically coupled to a clock node, and an output node configured to output the control-clock signal. The cascaded flip-flop chain may comprise a first multiplexer, a first flip-flop, a second multiplexer, and a second flip-flop. The first flip-flop and the second flip-flop each may have a data input terminal, a set input terminal, a clock input terminal, and an output terminal. The first multiplexer and the second multiplexer can have a first input terminal, a second input terminal, and an output terminal. The output terminal of the first multiplexer may be electrically coupled to the data input terminal of the first flip-flop, and the output terminal of the second multiplexer may be electrically coupled to the data input terminal of the second flip-flop. The output terminal of the first flip-flop may be electrically coupled to the first input terminal of the second multiplexer and may be configured to output a first one of the one or more control signals. The output terminal of the second flip-flop may be electrically coupled to the second input terminal of the first multiplexer and may be configured to output a second one of the one or more control signals. The set input terminal of the first flip-flop may be electrically coupled to the output terminal of the first comparator, and the set input terminal of the second flip-flop may be electrically coupled to the output terminal of the logic gate. The clock input terminal of the first flip-flop and the clock input terminal of the second flip-flop may be electrically coupled to the output node of the logic circuit. Further, in the photo sensor, the logic circuit may comprise an AND gate and an OR gate. The AND gate can have a first input terminal electrically coupled to the second input node of the logic circuit, a second input terminal electrically coupled to the third input node of the logic circuit, and an output terminal. The OR gate can have a first input terminal electrically coupled to the first input node of the logic circuit, a second input terminal electrically coupled to the output terminal of the AND gate, and an output terminal electrically coupled to the output node of the logic circuit.

In the photo sensor, the filter circuit can have a second output node. The filter circuit can be configured to output an integrated signal on the second output node of the filter circuit, and the integrated signal can correspond to the filter signal on the first output node of the filter circuit. The peak detector circuit can have a second input node electrically coupled to the second output node of the filter circuit, a second output node, and a third output node. The peak detector circuit can be configured to output an upper threshold signal on the second output node of the peak detector circuit and a lower threshold signal on the third output node of the peak detector circuit. The output circuit may comprise a first comparator, a second comparator, and a latch. The first comparator can have a first input terminal electrically coupled to the second output node of the peak detector circuit, a second input terminal electrically coupled to the first input node of the output circuit, and an output terminal. The second comparator can have a first input terminal electrically coupled to the first input node of the output circuit, a second input terminal electrically coupled to the third output node of the peak detector circuit, and an output terminal. The latch can have a first input terminal electrically coupled to the output terminal of the first comparator, a second input terminal electrically coupled to the output terminal of the second comparator, and an output terminal electrically coupled to the output node of the output circuit. In the photo sensor, the output circuit further may comprise a first logic gate, a flip-flop, and a second logic gate. The first logic gate can have a first input terminal electrically coupled to the output terminal of the first comparator, a second input terminal electrically coupled to the output terminal of the second comparator, and an output terminal. The flip-flop can have a data input terminal, a clock input terminal electrically coupled to a clock node, a reset input terminal electrically coupled to the output terminal of the first logic gate, and an output terminal. The second logic gate can have a first input terminal electrically coupled to the output terminal of the flip-flop, a second input terminal electrically coupled to the clock node, and an output terminal. The latch can have a third input terminal electrically coupled to the output terminal of the second logic gate.

In the photo sensor, the filter circuit may comprise a low pass filter circuit and a high pass filter circuit. The low pass filter circuit can have an input node electrically coupled to the input node of the filter circuit, and can have an output node. The high pass filter circuit can have an input node electrically coupled to the output node of the low pass filter circuit, and can have an output node electrically coupled to the first output node of the filter circuit.

In accordance with a further embodiment, a photo sensor comprises a photo diode, a filter circuit, a peak detector circuit, a gain control circuit, and an output circuit. The filter circuit has an input node configured to be electrically coupled to the photo diode, a first output node, and a second output node. The filter circuit has an adjustable gain based on one or more control signals received on one or more input control nodes. The peak detector circuit has a first input node electrically coupled to the first output node of the filter circuit and has an output node. The peak detector circuit is configured to provide a peak signal on the output node of the peak detector circuit, and the peak signal is based on a first filter signal on the first output node of the filter circuit. The gain control circuit has a first input node electrically coupled to the output node of the peak detector circuit and has one or more output nodes respectively electrically coupled to the one or more input control nodes of the filter circuit. The gain control circuit is configured to output the one or more control signals based on a comparison of the peak signal to one or more reference voltages. The output circuit has a first input node electrically coupled to the second output node of the filter circuit and has an output node.

In the photo sensor, the photo diode, the filter circuit, the peak detector circuit, the gain control circuit, and the output circuit may be on a same single chip.

In the photo sensor, the filter circuit may comprise a low pass filter circuit and a high pass filter circuit. The low pass filter circuit can have an input node electrically coupled to the input node of the filter circuit, and can have an output node electrically coupled to the first output node of the filter circuit. The high pass filter circuit can have an input node configured to be electrically coupled to the output node of the low pass filter circuit, and can have an output node electrically coupled to the second output node of the filter circuit.

In the photo sensor, the gain control circuit may comprise a first comparator and a second comparator each having a first input terminal, a second input terminal, and an output terminal. The first input terminal of the first comparator and the first input terminal of the second comparator may be electrically coupled to the first input node of the gain control circuit. The second input terminal of the first comparator may be electrically coupled to a first reference voltage node of the one or more reference voltages. The second input terminal of the second comparator may be electrically coupled to a second reference voltage node of the one or more reference voltages. The output terminal of the first comparator may be configured to output a first one of the one or more control signals. The output terminal of the second comparator may be configured to output a second one of the one or more control signals.

In the photo sensor, the output circuit may comprise an integrator circuit, a comparator, and a buffer. The integrator circuit can have an input node electrically coupled to the second output node of the filter circuit and can have an output node. The comparator can have a first input terminal electrically coupled to the second output node of the filter circuit, a second input terminal electrically coupled to the output node of the integrator, and an output terminal. The buffer can have an input terminal electrically coupled to the output terminal of the comparator and can have an output terminal electrically coupled to the output node of the output circuit.

In accordance with a yet further embodiment, a method comprises inputting, into a filter circuit, an input signal from a photo diode; generating, by the filter circuit, a filter output signal in response to the input signal; generating, by a peak detector, a peak signal in response to the filter output signal; and controlling an adjustable gain of the filter circuit using gain select signals generated by a gain control circuit in response to the filter output signal and the peak signal.

In the method, the gain control circuit may comprise cascaded flip-flops, and each flip-flop of the cascaded flip-flops may output one of the gain select signals. Controlling the adjustable gain may comprise, while the filter output signal is greater than an upper reference voltage, sequentially setting the cascaded flip-flops to sequentially decrease the adjustable gain of the filter circuit. Controlling the adjustable gain may also comprise, while the filter output signal is not greater than the upper reference voltage and is greater than a mid reference voltage, holding respective states of the cascaded flip-flops. Controlling the adjustable gain may further comprise, while the filter output signal is not greater than the mid reference voltage: (i) while a lower reference voltage is greater than the peak signal, feeding back signals output by respective subsequent ones of the cascaded flip-flops to immediately preceding ones of the cascaded flip-flops each clock cycle to increase the adjustable gain of the filter circuit; and (ii) while the lower reference voltage is not greater than the peak signal, holding states of the cascaded flip-flops. In the method, upon a transition from (i) the filter output signal being not greater than the mid reference voltage and (ii) the lower reference voltage is not greater than the peak signal to (i) the filter output signal being greater than the mid reference voltage and (ii) the lower reference voltage being greater than the peak signal, signals output by respective preceding ones of the cascaded flip-flops to immediately subsequent ones of the cascaded flip-flops may be propagated.

In the method, the filter circuit may comprise a low pass filter circuit and a high pass filter circuit. The input signal may be input into the low pass filter circuit. Generating the filter output signal may comprise generating, by the low pass filter circuit, a filter intermediate signal in response to the input signal; inputting, into the high pass filter circuit, the filter intermediate signal; and generating, by the high pass filter circuit, the filter output signal in response to the filter intermediate signal. In the method, the low pass filter circuit can have a first adjustable gain controlled by at least some of the gain select signals, and the high pass filter circuit can have a second adjustable gain controlled by at least some of the gain select signals.

The method may further comprise outputting an output signal by an output circuit in response to the filter output signal. In the method, outputting the output signal by the output circuit may comprise generating an upper threshold signal and a lower threshold signal based on the peak signal; when the filter output signal is greater than the upper threshold signal, outputting a digital high signal as the output signal; when the filter output signal is not greater than the lower threshold signal, outputting a digital low signal as the output signal; and when the filter output signal is not greater than the upper threshold signal and is greater than the lower threshold signal: (i) if at an immediately preceding clock cycle the output signal was the digital high signal, outputting a digital high signal as the output signal for at least one additional clock cycle; and (ii) otherwise, outputting a digital low signal as the output signal.

In another embodiment, a method comprises inputting, into a filter circuit, an input signal from a photo diode; generating, by the filter circuit, a filter intermediate signal and a filter output signal in response to the input signal; generating, by a peak detector, a peak signal in response to the filter intermediate signal; and controlling an adjustable gain of the filter circuit using gain select signals generated by a gain control circuit in response to the peak signal.

In the method, controlling the adjustable gain may comprise comparing the peak signal to a plurality of reference voltages. The gain select signals may each be based on a comparison of the peak signal to a respective one of the plurality of reference voltages.

In the method, the filter circuit may comprise a low pass filter circuit and a high pass filter circuit. The input signal may be input into the low pass filter circuit. Generating the filter intermediate signal and the filter output signal may comprise generating, by the low pass filter circuit, the filter intermediate signal in response to the input signal; inputting, into the high pass filter circuit, the filter intermediate signal; and generating, by the high pass filter circuit, the filter output signal in response to the filter intermediate signal. In the method, the low pass filter circuit can have a first adjustable gain controlled by at least some of the gain select signals, and the high pass circuit can have a second adjustable gain controlled by at least some of the gain select signals.

The method may further comprise outputting an output signal by an output circuit in response to the filter output signal. In the method, outputting the output signal may comprise generating an integrated signal by integrating the filter output signal; and comparing the integrated signal to the filter output signal. The output signal may be based on the comparison.

A person of ordinary skill in the art will appreciate that embodiments described herein are merely illustrative and are not intended to limit the scope of the disclosure. In particular, the circuits and devices described herein may include any combination of hardware and/or software that can perform the indicated operations. Although some embodiments and their advantages have been disclosed herein, it should be understood that various changes, substitutions, permutations, and alterations can be made without departing from the scope of the invention as defined by the claims. It will be appreciated that any feature that is described in a connection to any one embodiment may also be applicable to any other embodiment.

What is claimed:

1. A photo sensor comprising:
a photo diode;
a filter circuit having an input node configured to be electrically coupled to an output node of the photo diode, and having an output node, the filter circuit having an adjustable gain, the adjustable gain being adjustable based on a signal output from the filter circuit, the adjustable gain being configured to be adjustable at an edge of a clock signal;
an output circuit having an input node configured to be electrically coupled to the output node of the filter circuit; and
wherein the filter circuit comprises a low pass filter and a high pass filter, wherein:
the low pass filter has an input node that is the input node of the filter circuit, and has an output node, and
the high pass filter has an input node configured to be electrically coupled to the output node of the low pass filter, and has an output node that is the output node of the filter circuit.

2. The photo sensor of claim 1, wherein:
the low pass filter has a first adjustable gain configured to be adjustable based on the signal output from the filter circuit on the output node of the high pass filter; and
the high pass filter has a second adjustable gain configured to be adjustable based on the signal output from the filter circuit on the output node of the high pass filter.

3. The photo sensor of claim 1 further comprising control circuitry configured to output one or more control signals operable to control the adjustable gain based on the signal output from the filter circuit.

4. The photo sensor of claim 3 further comprising peak detector circuitry configured to output a peak signal based on the signal output from the filter circuit, wherein the control circuitry is further configured to output the one or more control signals based on the peak signal.

5. The photo sensor of claim 3 further comprising reference voltage circuitry configured to output a plurality of reference voltages, wherein the control circuitry is further configured to output the one or more control signals based on a comparison between the signal output from the filter circuit and one or more of the plurality of reference voltages.

6. The photo sensor of claim 1 further comprising:
reference voltage circuitry configured to output a first reference voltage, a second reference voltage, and a third reference voltage, wherein the first reference voltage is greater than the second reference voltage, and the second reference voltage is greater than the third reference voltage;
peak detector circuitry configured to output a peak signal based on the signal output from the filter circuit; and
control circuitry comprising a first multiplexer-flip-flop pair and a second multiplexer-flip-flop pair; and
wherein:
the first multiplexer-flip-flop pair comprises a first multiplexer and a first flip-flop, and the second multiplexer-flip-flop pair comprises a second multiplexer and a second flip-flop;
an output terminal of the first multiplexer is electrically connected to a data input terminal of the first flip-flop, and an output terminal of the second multiplexer is electrically connected to a data input terminal of the second flip-flop;
an output terminal of the first flip-flop is configured to output at least a first control signal, and an output terminal of the second flip-flop is configured to output a second control signal, the first control signal and the second control signal being operable to control the adjustable gain;
the output terminal of the first flip-flop is electrically connected to an input terminal of the second multiplexer;
the output terminal of the second flip-flop is electrically connected to an input terminal of the first multiplexer;
a set input terminal of the first flip-flop is configured to receive a first set signal based on a first comparison of the signal output from the filter circuit to the first reference voltage, and a set input terminal of the second flip-flop is configured to receive a second set signal based on the first comparison or a time-delayed second comparison of the signal output from the filter circuit to the first reference voltage;

a clock input terminal of the first flip-flop and a clock input terminal of the second flip-flop are configured to receive a control signal based on the clock signal, a third comparison of the peak signal to the third reference voltage, and a fourth comparison of the signal output from the filter circuit and the second reference voltage; and a select control input terminal of the first multiplexer and a select control input terminal of the second multiplexer are configured to receive a signal based on the fourth comparison of the signal output from the filter circuit and the second reference voltage.

7. The photo sensor of claim 1 further comprising:

peak detector circuitry configured to output an upper threshold signal and a lower threshold signal, the upper threshold signal and the lower threshold signal being based on a peak signal based on the signal output from the filter circuit; and wherein the output circuit comprises:

a first comparator configured to compare the signal output from the filter circuit to the upper threshold signal and to output a first channel signal;

a second comparator configured to compare the signal output from the filter circuit to the lower threshold signal and to output a second channel signal; and a latch configured to receive the first channel signal and the second channel signal.

8. A photo sensor comprising:

a photo diode;

a filter circuit having an input node electrically coupled to the photo diode and having a first output node, wherein the filter circuit has an adjustable gain based on one or more control signals received on one or more input control nodes;

a peak detector circuit having a first input node electrically coupled to the first output node of the filter circuit and having a first output node, wherein the peak detector circuit is configured to provide a peak signal on the first output node of the peak detector circuit, the peak signal being based on a filter signal on the first output node of the filter circuit;

a gain control circuit having a first input node electrically coupled to the first output node of the peak detector circuit, a second input node electrically coupled to the first output node of the filter circuit, and one or more output nodes respectively electrically coupled to the one or more input control nodes of the filter circuit, wherein the gain control circuit is configured to output the one or more control signals based on the peak signal, the filter signal, and a control-clock signal;

an output circuit having a first input node electrically coupled to the first output node of the filter circuit and having an output node;

wherein the gain control circuit comprises a first comparator, a second comparator, and a third comparator each having a first input terminal, a second input terminal, and an output terminal; and wherein:

the first input terminal of the first comparator and the first input terminal of the second comparator are electrically coupled to the second input node of the gain control circuit, the second input terminal of the first comparator is electrically coupled to an upper reference voltage node, the second input terminal of the second comparator is electrically coupled to a mid reference voltage node, the first input terminal of the third comparator is electrically coupled to a lower reference voltage node, the second input terminal of the third comparator is electrically coupled to the first input node of the gain control circuit, a delay element having an input terminal electrically coupled to the output terminal of the first comparator, and having an output terminal, a logic gate having a first input terminal electrically coupled to the output terminal of the first comparator, a second input terminal electrically coupled to the output terminal of the delay element, and an output terminal, a logic circuit having a first input node electrically coupled to the output terminal of the second comparator, a second input node electrically coupled to the output terminal of the third comparator, a third input node electrically coupled to a clock node, and an output node configured to output the control-clock signal, and a cascaded flip-flop chain comprising a first multiplexer, a first flip-flop, a second multiplexer, and a second flip-flop, wherein:

the first flip-flop and the second flip-flop each have a data input terminal, a set input terminal, a clock input terminal, and an output terminal, the first multiplexer and the second multiplexer have a first input terminal, a second input terminal, and an output terminal, the output terminal of the first multiplexer is electrically coupled to the data input terminal of the first flip-flop, and the output terminal of the second multiplexer is electrically coupled to the data input terminal of the second flip-flop, the output terminal of the first flip-flop is electrically coupled to the first input terminal of the second multiplexer and is configured to output a first one of the one or more control signals, the output terminal of the second flip-flop is electrically coupled to the second input terminal of the first multiplexer and is configured to output a second one of the one or more control signals, the set input terminal of the first flip-flop is electrically coupled to the output terminal of the first comparator, and the set input terminal of the second flip-flop is electrically coupled to the output terminal of the logic gate, and the clock input terminal of the first flip-flop and the clock input terminal of the second flip-flop are electrically coupled to the output node of the logic circuit.

9. The photo sensor of claim 8, wherein the photo diode, the filter circuit, the peak detector circuit, the gain control circuit, and the output circuit are on a same single chip.

10. The photo sensor of claim 8, wherein the logic circuit comprises:

an AND gate having a first input terminal electrically coupled to the second input node of the logic circuit, a second input terminal electrically coupled to the third input node of the logic circuit, and an output terminal;

an OR gate having a first input terminal electrically coupled to the first input node of the logic circuit, a second input terminal electrically coupled to the output terminal of the AND gate, and an output terminal electrically coupled to the output node of the logic circuit.

11. The photo sensor of claim 8, wherein:
the filter circuit has a second output node, the filter circuit being configured to output an integrated signal on the second output node of the filter circuit, the integrated signal corresponding to the filter signal on the first output node of the filter circuit;
the peak detector circuit has a second input node electrically coupled to the second output node of the filter circuit, a second output node, and a third output node, the peak detector circuit being configured to output an upper threshold signal on the second output node of the peak detector circuit and a lower threshold signal on the third output node of the peak detector circuit;
the output circuit comprises:
a first comparator having a first input terminal electrically coupled to the second output node of the peak detector circuit, a second input terminal electrically coupled to the first input node of the output circuit, and an output terminal;
a second comparator having a first input terminal electrically coupled to the first input node of the output circuit, a second input terminal electrically coupled to the third output node of the peak detector circuit, and an output terminal; and
a latch having a first input terminal electrically coupled to the output terminal of the first comparator, a second input terminal electrically coupled to the output terminal of the second comparator, and an output terminal electrically coupled to the output node of the output circuit.

12. The photo sensor of claim 11, wherein the output circuit further comprises:
a first logic gate having a first input terminal electrically coupled to the output terminal of the first comparator, a second input terminal electrically coupled to the output terminal of the second comparator, and an output terminal;
a flip-flop having a data input terminal, a clock input terminal electrically coupled to a clock node, a reset input terminal electrically coupled to the output terminal of the first logic gate, and an output terminal;
a second logic gate having a first input terminal electrically coupled to the output terminal of the flip-flop, a second input terminal electrically coupled to the clock node, and an output terminal; and
wherein the latch has a third input terminal electrically coupled to the output terminal of the second logic gate.

13. The photo sensor of claim 8, wherein:
the filter circuit comprises a low pass filter circuit and a high pass filter circuit;
the low pass filter circuit has an input node electrically coupled to the input node of the filter circuit, and has an output node; and
the high pass filter circuit has an input node electrically coupled to the output node of the low pass filter circuit, and has an output node electrically coupled to the first output node of the filter circuit.

14. A method comprising:
inputting, into a filter circuit, an input signal from a photo diode;
generating, by the filter circuit, a filter output signal in response to the input signal;
generating, by a peak detector, a peak signal in response to the filter output signal;
controlling an adjustable gain of the filter circuit using gain select signals generated by a gain control circuit in response to the filter output signal and the peak signal;
wherein the gain control circuit comprises cascaded flip-flops, each flip-flop of the cascaded flip-flops outputting one of the gain select signals; and
wherein controlling the adjustable gain comprises:
while the filter output signal is greater than an upper reference voltage, sequentially setting the cascaded flip-flops to sequentially decrease the adjustable gain of the filter circuit,
while the filter output signal is not greater than the upper reference voltage and is greater than a mid reference voltage, holding respective states of the cascaded flip-flops,
while the filter output signal is not greater than the mid reference voltage:
while a lower reference voltage is greater than the peak signal, feeding back signals output by respective subsequent ones of the cascaded flip-flops to immediately preceding ones of the cascaded flip-flops each clock cycle to increase the adjustable gain of the filter circuit, and
while the lower reference voltage is not greater than the peak signal, holding states of the cascaded flip-flops.

15. The method of claim 14, wherein upon a transition from (i) the filter output signal being not greater than the mid reference voltage and (ii) the lower reference voltage is not greater than the peak signal to (i) the filter output signal being greater than the mid reference voltage and (ii) the lower reference voltage is greater than the peak signal, propagating signals output by respective preceding ones of the cascaded flip-flops to immediately subsequent ones of the cascaded flip-flops.

16. The method of claim 14, wherein the filter circuit comprises a low pass filter circuit and a high pass filter circuit, wherein the input signal is input into the low pass filter circuit, and wherein generating the filter output signal comprises:
generating, by the low pass filter circuit, a filter intermediate signal in response to the input signal;
inputting, into the high pass filter circuit, the filter intermediate signal; and
generating, by the high pass filter circuit, the filter output signal in response to the filter intermediate signal.

17. The method of claim 14 further comprising outputting an output signal by an output circuit in response to the filter output signal, wherein outputting the output signal by the output circuit comprises:
generating an upper threshold signal and a lower threshold signal based on the peak signal;
when the filter output signal is greater than the upper threshold signal, outputting a digital high signal as the output signal;
when the filter output signal is not greater than the lower threshold signal, outputting a digital low signal as the output signal; and
when the filter output signal is not greater than the upper threshold signal and is greater than the lower threshold signal:
if at an immediately preceding clock cycle the output signal was the digital high signal, outputting a digital high signal as the output signal for at least one additional clock cycle; and
otherwise, outputting a digital low signal as the output signal.

* * * * *